United States Patent
Lee et al.

(10) Patent No.: US 12,503,764 B2
(45) Date of Patent: Dec. 23, 2025

(54) SUBSTRATE PROCESSING METHOD

(71) Applicant: ASM IP Holding B.V., Almere (NL)

(72) Inventors: ChangWan Lee, Daejeon (KR); KyungEun Lee, Suwon-si (KR); HakJoon Lee, Seoul (KR); SungKyu Kang, Hwaseong-si (KR)

(73) Assignee: ASM IP Holding B.V., Almere (NL)

( * ) Notice: Subject to any disclaimer, the term of this patent is extended or adjusted under 35 U.S.C. 154(b) by 166 days.

(21) Appl. No.: 17/951,551

(22) Filed: Sep. 23, 2022

(65) Prior Publication Data

US 2023/0096453 A1    Mar. 30, 2023

Related U.S. Application Data

(60) Provisional application No. 63/249,464, filed on Sep. 28, 2021.

(51) Int. Cl.
| | |
|---|---|
| *C23C 16/455* | (2006.01) |
| *C23C 16/04* | (2006.01) |
| *C23C 16/56* | (2006.01) |
| *H01L 21/02* | (2006.01) |
| *H01L 21/768* | (2006.01) |

(52) U.S. Cl.
CPC ...... *C23C 16/45536* (2013.01); *C23C 16/045* (2013.01); *C23C 16/56* (2013.01); *H01L 21/02164* (2013.01); *H01L 21/02219* (2013.01); *H01L 21/02274* (2013.01); *H01L 21/0228* (2013.01); *H01L 21/76837* (2013.01)

(58) Field of Classification Search
None
See application file for complete search history.

(56) References Cited

U.S. PATENT DOCUMENTS

| | | | |
|---|---|---|---|
| 6,410,446 B1* | 6/2002 | Tsai | H01L 21/02274 |
| | | | 257/E21.576 |
| 8,119,527 B1* | 2/2012 | Chadrashekar | H01L 21/67161 |
| | | | 257/E21.586 |
| 2005/0221000 A1* | 10/2005 | Ikeda | C23C 16/02 |
| | | | 427/532 |
| 2014/0106574 A1* | 4/2014 | Kang | H01L 21/02164 |
| | | | 438/778 |
| 2014/0141542 A1* | 5/2014 | Kang | H01L 22/20 |
| | | | 438/761 |
| 2016/0362782 A1* | 12/2016 | Cheng | C23C 16/4408 |
| 2017/0229337 A1* | 8/2017 | Park | C23C 16/045 |
| 2017/0330796 A1* | 11/2017 | Ruffell | C23C 16/50 |
| 2019/0363006 A1* | 11/2019 | Min | H01L 21/3105 |

(Continued)

OTHER PUBLICATIONS

Mahowald et al. Plasma-Enhanced Chemical Vapor Deposition Of Tungsten. Thin Solid Films, 170 (1989) 91-97 (Year: 1989).*

*Primary Examiner* — Jose I Hernandez-Kenney
(74) *Attorney, Agent, or Firm* — Snell & Wilmer L.L.P.

(57) ABSTRACT

A substrate processing method for gap-filling a recess between a first protrusion and a second protrusion of a pattern structure includes: changing a profile of a layer formed on the pattern structure, wherein the changing of the profile of the layer includes: in an upper area, increasing a width of the recess to suppress formation of a void in the upper area; and, in a lower area, reducing the width of the recess to contact the layer, thereby inducing formation of a void under the lower area, and thus allows a position of the void to be adjusted.

18 Claims, 20 Drawing Sheets

(56) References Cited

U.S. PATENT DOCUMENTS

2020/0312652 A1\* 10/2020 Kang ................... H01L 21/0234
2022/0205096 A1\* 6/2022 Abel ..................... C23C 16/045
2022/0301823 A1\* 9/2022 Yoo .................... H01J 37/32082

\* cited by examiner

SUBSTRATE PROCESSING METHOD

CROSS-REFERENCE TO RELATED APPLICATIONS

This application claims priority to U.S. Provisional Patent Application Ser. No. 63/249,464, filed Sep. 28, 2021, and titled SUBSTRATE PROCESSING METHOD, the disclosure of which is hereby incorporated by reference in its entirety.

BACKGROUND

1. Field

One or more embodiments relate to a substrate processing method, and more particularly, to a method of filling a gap structure.

2. Description of the Related Art

As the degree of integration of semiconductor devices increases, the aspect ratio (A/R) of pattern structures is also increasing. For example, as a depth versus width of an entrance of a gap structure increases, the technical difficulty of filling the gap structure without seams or voids is increasing. An atomic layer deposition method has the advantage of enabling the deposition of a film having a uniform thickness on the walls and bottom surfaces of a pattern structure. However, in the case of layer-by-layer deposition in which thin films are sequentially stacked, as films stacked facing each other in a pattern structure with a gap come into contact with each other, a boundary surface is generated and a void remains at the boundary surface. When the voids are exposed to the outside in a subsequent process, the performance of a semiconductor device is deteriorated. For example, the insulating performance may be deteriorated due to penetration of a metal wiring or interconnection material in metallization process.

SUMMARY

One or more embodiments include a substrate processing method capable of preventing the problem of exposing voids in a subsequent process by allowing voids to be formed at a lower portion of a gap in a gap-filling process of filling a gap structure.

Additional aspects will be set forth in part in the description which follows and, in part, will be apparent from the description, or may be learned by practice of the presented embodiments of the disclosure.

According to one or more embodiments, a substrate processing method includes: providing a pattern structure having a first protrusion and a second protrusion, wherein upper surfaces of the first protrusion and the second protrusion each have a planar portion and an edge portion surrounding the planar portion; forming a first layer of a first thickness on the pattern structure, wherein a first recess of a first width is formed between the first protrusion and the second protrusion by the formation of the first layer; and changing a profile of the first layer, wherein the profile of the first layer is changed such that a width of the first recess in a first upper area adjacent to edge portions of the first protrusion and the second protrusion increases, and a width of the first recess in a first lower area below the first upper area decreases.

According to an example of the substrate processing method, a cycle including the forming of the first layer and the changing of the profile of the first layer is repeated a plurality of times to achieve gap-filling of a space between the first protrusion and the second protrusion.

According to another example of the substrate processing method, the cycle includes: forming a second layer on the first layer, wherein a second recess is formed between the first protrusion and the second protrusion by the formation of the second layer; and changing a profile of the second layer. During the changing of the profile of the second layer, a width of the second recess in a second upper area may increase, and a width of the second recess in a second lower area below the second upper area may decrease.

According to another example of the substrate processing method, the second lower area may be below the first lower area.

According to another example of the substrate processing method, due to a decrease in the width of the second recess in the second lower area, a first portion on a side surface of the first protrusion of the second layer and a second portion on a side surface of the second protrusion of the second layer may come into contact with each other to form a void.

According to another example of the substrate processing method, the void may be included in the second lower area.

According to another example of the substrate processing method, the forming of the first layer may include applying first plasma, and the changing of the profile of the first layer may include applying second plasma.

According to another example of the substrate processing method, a power level of the second plasma may be greater than a power level of the first plasma.

According to another example of the substrate processing method, a frequency of the second plasma may be lower than a frequency of the first plasma.

According to another example of the substrate processing method, the frequency of the first plasma may be a first range of frequencies, and the frequency of the second plasma may include the first range of frequencies and a second range of frequencies that is lower than the first range.

According to another example of the substrate processing method, a substrate processing apparatus configured to perform the substrate processing method may include a matching network, wherein the matching network may be configured to perform a first matching operation for the first range of frequencies and a second matching operation for the second range of frequencies.

According to another example of the substrate processing method, the applying of the first plasma may be performed for a first time period, the applying of the second plasma may be performed for a second time period, and by adjusting a ratio between the first time period and the second time period, a position of a void remaining after gap-filling of the pattern structure may be changed.

According to another example of the substrate processing method, a first sub-cycle including the applying of the first plasma during the forming of the first layer may be performed a plurality of times, a second sub-cycle including the applying of the second plasma during the changing of the profile of the first layer may be performed a plurality of times, and by adjusting a ratio between the number of repetitions of the second sub-cycle and the number of repetitions of the first sub-cycle, a position of a void remaining after gap-filling of the pattern structure may be changed.

According to another example of the substrate processing method, the forming of the first layer may include supplying a source gas, supplying a reactant gas, and applying first plasma, and the changing of the profile of the first layer may include supplying the reactant gas and applying second plasma different from the first plasma.

According to another example of the substrate processing method, the supplying of the source gas, the supplying of the reactant gas, and the applying of the first plasma may be performed for the same time period.

According to another example of the substrate processing method, the supplying of the source gas and the supplying of the reactant gas may be pre-supplied before the same time period.

According to another example of the substrate processing method, the forming of the first layer may further include at least one of supplying a purge gas between the supplying of the source gas and the supplying of the reactant gas, and supplying a purge gas after the supplying of the reactant gas.

According to another example of the substrate processing method, the reactant gas may be used as the purge gas.

According to one or more embodiments, a substrate processing method for gap-filling a recess between a first protrusion and a second protrusion of a pattern structure, the method includes: changing a profile of a layer formed on the pattern structure, wherein the changing of the profile of the layer includes: in an upper area, increasing a width of the recess to suppress formation of a void in the upper area; and, in a lower area, reducing the width of the recess to contact the layer, thereby inducing formation of a void under the lower area.

According to one or more embodiments, a substrate processing method performs a cycle including a first sub-cycle and a second sub-cycle a plurality of times, wherein the first sub-cycle includes: supplying RF power under a first condition to weaken a bonding force within molecules of the source gas and decompose the source gas; and purging a residue, and the second sub-cycle includes: supplying the reactant gas and RF power under a second condition for breaking a bonding structure of a layer formed by the first sub-cycle; and purging a residue.

BRIEF DESCRIPTION OF THE DRAWINGS

The above and other aspects, features, and advantages of certain embodiments of the disclosure will be more apparent from the following description taken in conjunction with the accompanying drawings, in which.

DETAILED DESCRIPTION

Figure 1:
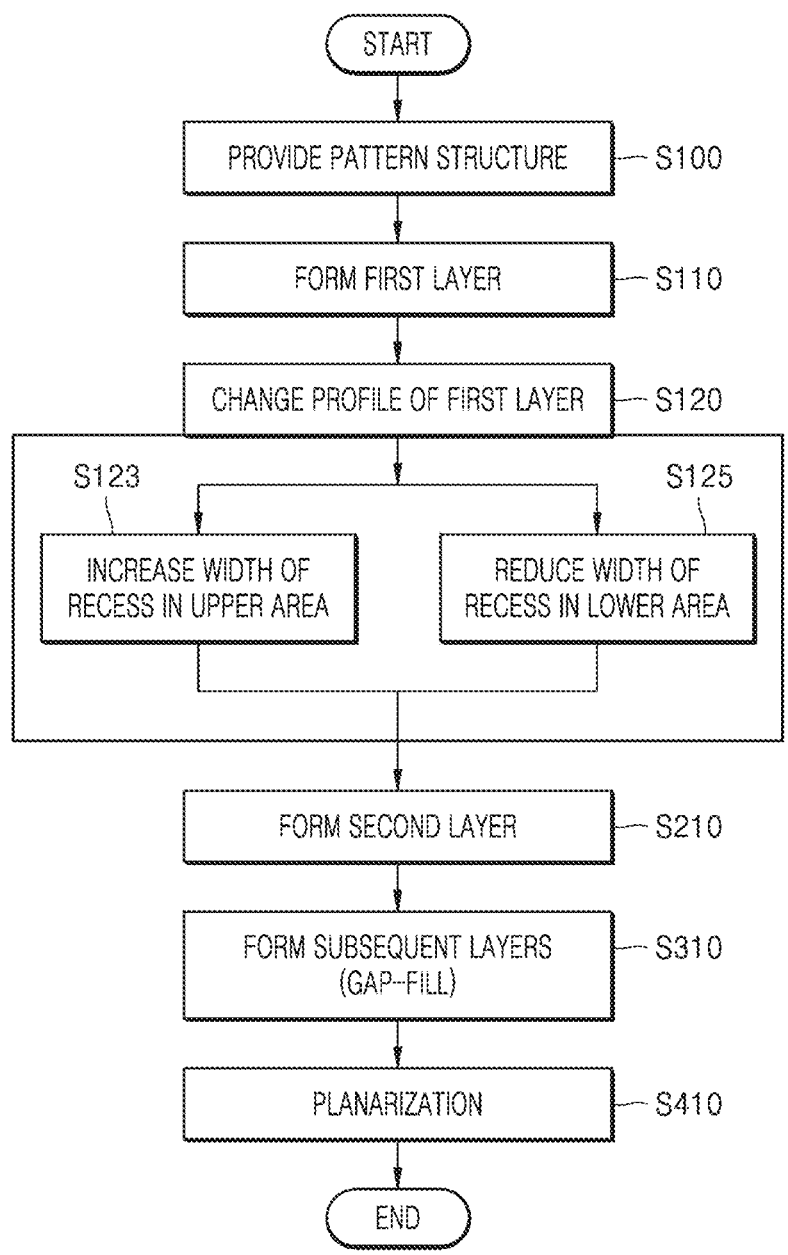
FIG. 1 is a flowchart of a substrate processing method according to embodiments.

Reference will now be made in detail to embodiments, examples of which are illustrated in the accompanying drawings, wherein like reference numerals refer to like elements throughout. In this regard, the present embodiments may have different forms and should not be construed as being limited to the descriptions set forth herein. Accordingly, the embodiments are merely described below, by referring to the figures, to explain aspects of the present description. As used herein, the term "and/or" includes any and all combinations of one or more of the associated listed items. Expressions such as "at least one of," when preceding a list of elements, modify the entire list of elements and do not modify the individual elements of the list.

Hereinafter, embodiments of the disclosure will be described in detail with reference to the accompanying drawings.

In this regard, the present embodiments may have different forms and should not be construed as being limited to the descriptions set forth herein. Rather, these embodiments are provided so that the disclosure will be thorough and complete, and will fully convey the scope of the disclosure to one of ordinary skill in the art.

The terminology used herein is for describing particular embodiments and is not intended to limit the disclosure. As used herein, the singular forms "a", "an", and "the" are intended to include the plural forms as well, unless the context clearly indicates otherwise. It will be further understood that the terms "includes", "comprises" and/or "including", "comprising" used herein specify the presence of stated features, integers, steps, processes, members, components, and/or groups thereof, but do not preclude the presence or addition of one or more other features, integers, steps, processes, members, components, and/or groups thereof. As used herein, the term "and/or" includes any and all combinations of one or more of the associated listed items.

It will be understood that, although the terms first, second, etc. may be used herein to describe various members, components, regions, layers, and/or sections, these members, components, regions, layers, and/or sections should not be limited by these terms. These terms do not denote any order, quantity, or importance, but rather are only used to distinguish one component, region, layer, and/or section from another component, region, layer, and/or section. Thus, a first member, component, region, layer, or section discussed below could be termed a second member, component, region, layer, or section without departing from the teachings of embodiments.

Embodiments of the disclosure will be described hereinafter with reference to the drawings in which embodiments of the disclosure are schematically illustrated. In the drawings, variations from the illustrated shapes may be expected because of, for example, manufacturing techniques and/or tolerances. Thus, the embodiments of the disclosure should not be construed as being limited to the particular shapes of regions illustrated herein but may include deviations in shapes that result, for example, from manufacturing processes.

FIG. 1 is a flowchart of a substrate processing method according to embodiments. FIGS. 2 to 7 are cross-sectional views of a substrate processed by the substrate processing method illustrated in FIG. 1 in each stage.

Figure 2:
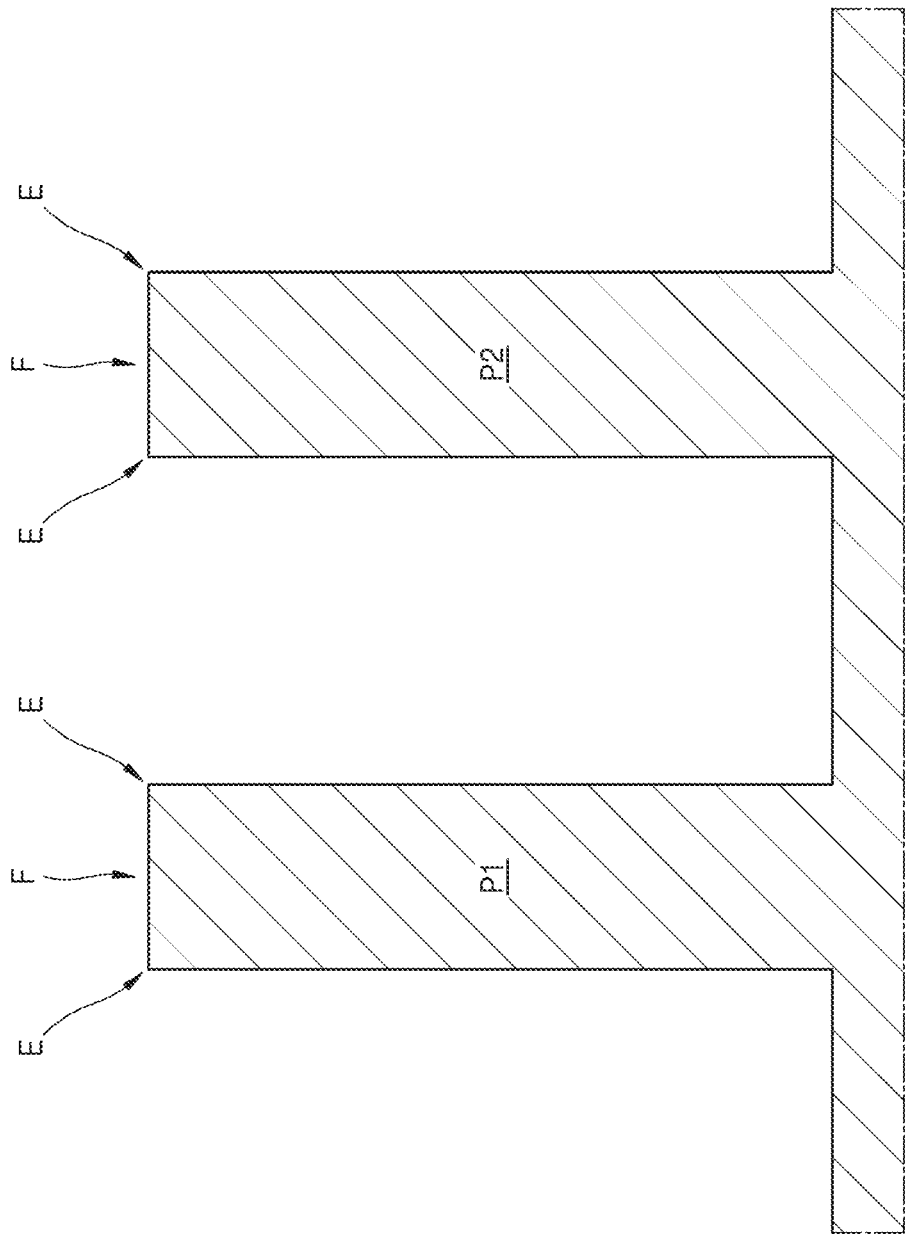
FIGS. 2 to 7 are cross-sectional views of a substrate processed by the substrate processing method illustrated in FIG. 1 in each stage.

Referring to FIGS. 1 and 2, first, in operation S100, a pattern structure having a first protrusion P1 and a second protrusion P2 is provided. Upper surfaces of the first protrusion P1 and the second protrusion P2 each may have a flat portion F and an edge portion E surrounding the flat portion F. In addition, an edge portion E of the first protrusion P1 and the second protrusion P2 may have a certain curvature.

The pattern structure is a non-flat structure, and may include an upper surface, a lower surface, and a side surface connecting the upper surface to the lower surface. The pattern structure may be used to form an active area or may be used to form a gate pattern. For example, when the pattern structure is used to implement a flash memory, each of the first protrusion P1 and the second protrusion P2 may include a gate electrode and a tunneling insulating layer. In another example, when the pattern structure is used to implement a metal contact, each of the first protrusion P1 and the second protrusion P2 may be an interlayer insulating layer.

The pattern structure may be formed on a substrate, and the substrate may be, for example, a semiconductor substrate or a display substrate. The substrate may include, for example, any one of silicon, silicon-on-insulator, silicon-on-sapphire, germanium, silicon-germanium, and gallium-arsenide.

Figure 3:
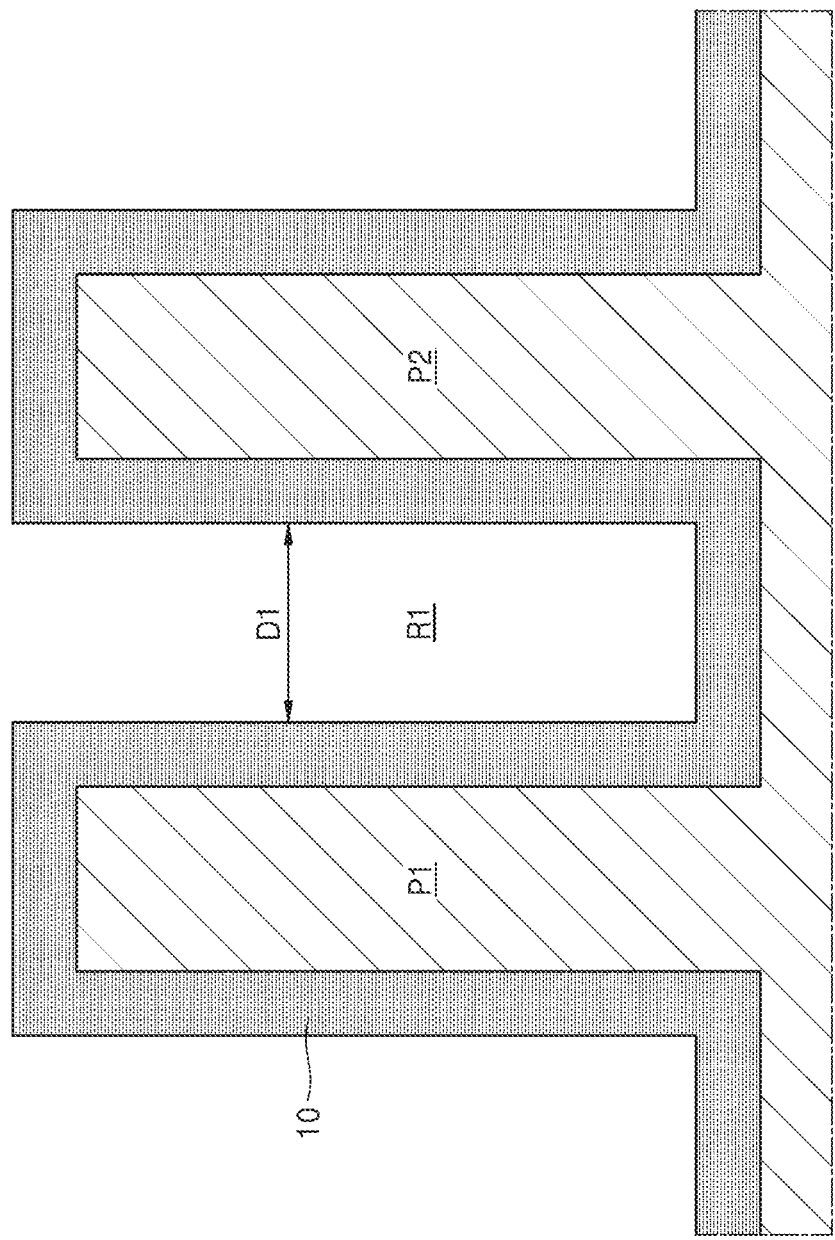

Referring to FIGS. 1 and 3, operation S110 of forming a first layer 10 on the pattern structure is performed. In order to form the first layer 10, supplying a source gas, supplying a reactant gas, and applying first plasma may be performed.

Because the first layer 10 is formed on the pattern structure, a first recess R1 may be defined by the first layer 10. In more detail, by forming the first layer 10 on a side surface of the first protrusion P1, a lower surface of the pattern structure between the first protrusion P1 and the second protrusion P2, and a side surface of the second protrusion P2, the first recess R1 surrounded by the first layer 10 may be formed. The first recess R1 may have a first width D1. A width of a recess may be defined, for example, as a distance (or an average of distances measured at multiple heights) between side surfaces of the first layer 10 measured at a certain height from a lower surface of a pattern structure.

Operation S110 of forming the first layer 10 may include the applying of the first plasma. For example, the first layer 10 may be formed by supplying a source gas and a reactant gas under the plasma atmosphere of a first condition. In some embodiments, a first sub-cycle including the applying of the first plasma may be repeated to form the first layer 10.

In some embodiments, the source gas and the reactant gas may be supplied simultaneously. In this case, the supplying of the source gas, the supplying of the reactant gas, and the applying of the first plasma may be performed for the same time period. In a further embodiment, the supplying of the source gas and the supplying of the reactant gas may be pre-supplied before the same time period. In other words, a source gas and a reactant gas may be supplied, and then, source gas supply, reactant gas supply, and first plasma application may be performed simultaneously.

In another embodiment, the source gas and the reactant gas may be sequentially supplied. In an optional embodiment, a purge operation (i.e., supply of a purge gas) may be performed between the supply of the source gas and the supply of the reactant gas. In another embodiment, an operation of purging a residue after the supply of the reactant gas may be performed. In an optional further embodiment, the supply of the purge gas may be continued during the forming of the first layer. In yet a further embodiment, the reactant gas may be used as the purge gas. In other words, the purge gas may be a reactive purge gas that acts as a reactant gas when plasma is applied.

For example, the first sub-cycle may include applying first plasma, supplying the source gas, and/or supplying the reactant gas (and further operations according to the modifications described above). In other words, to form the first layer 10, the first sub-cycle including at least one of the above operations may be repeated.

In some embodiments, the operation of applying the first plasma may be performed during the supplying of the source gas. Therefore, when a silicon precursor is used as the source gas, a bonding force within molecules of the silicon precursor may be weakened by plasma application. To this end, during the application of the first plasma, power under the first condition (e.g., RF power) for weakening a bonding force of molecules of the source gas may be applied.

Figure 4:
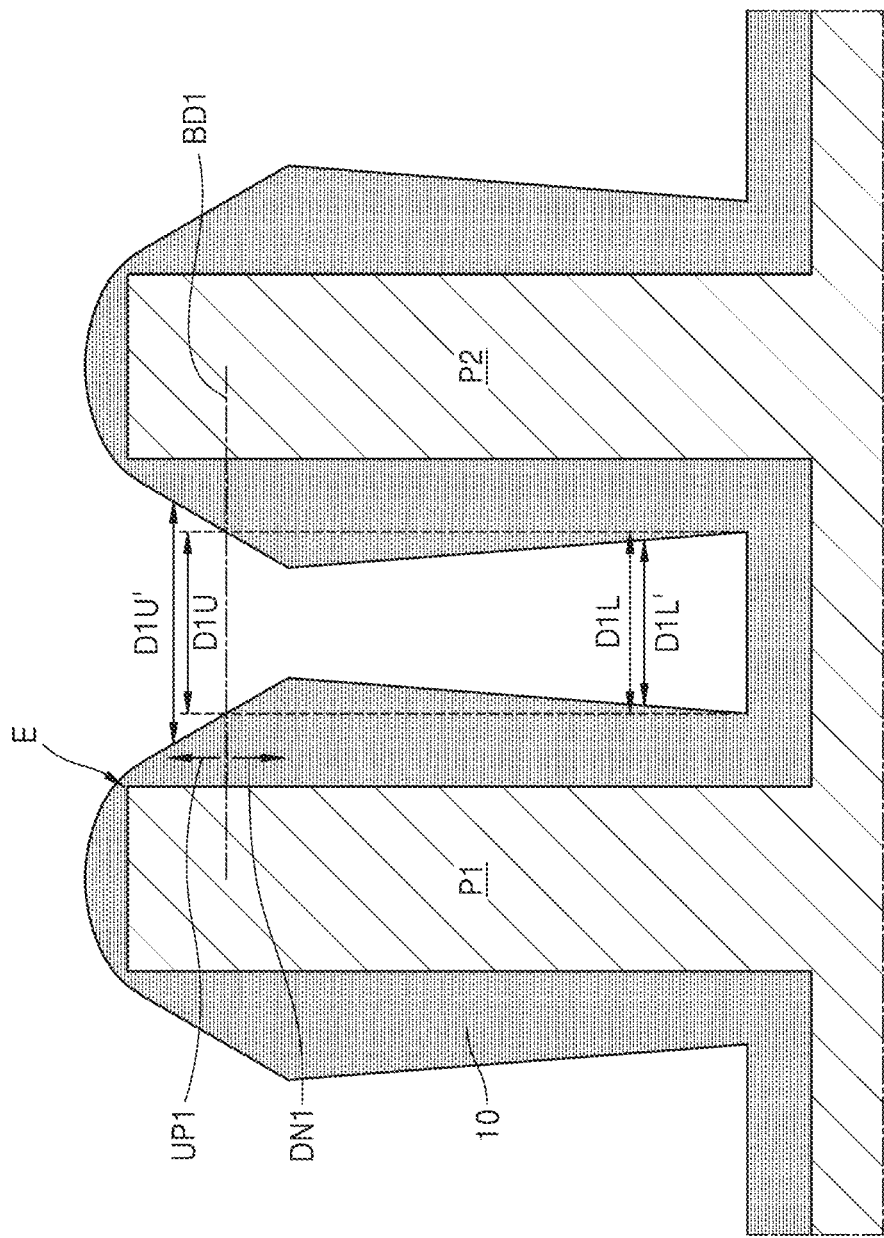
Figure 5:
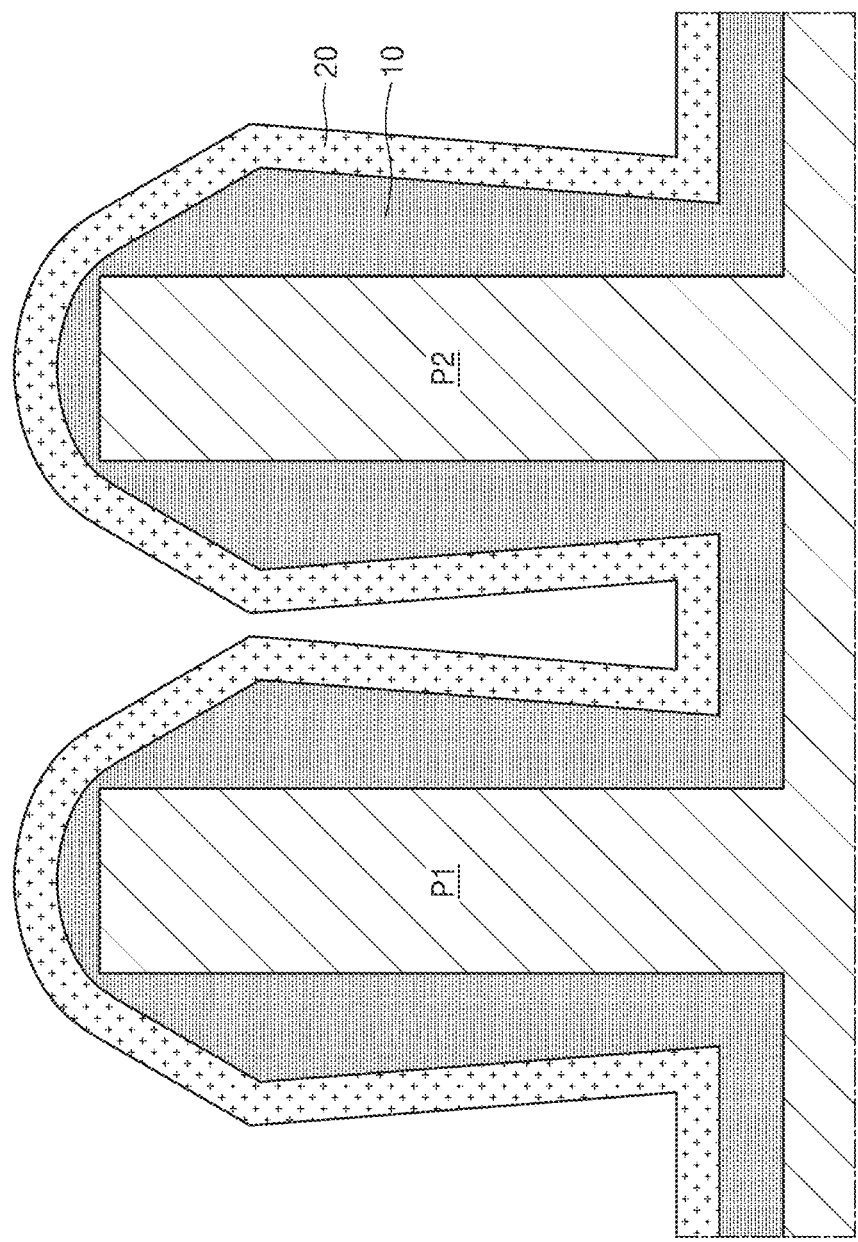

Referring to FIGS. 1 and 4, after the first layer 10 is formed, operation S120 of changing a profile of the first layer 10 is performed. Operation S120 of changing the profile of the first layer 10 may include operation S123 of increasing a width of the first recess R1 in a first upper area UP1 adjacent to edge portions E of the first protrusion P1 and the second protrusion P2, and operation S125 of reducing a width of the first recess R1 in a first lower area DN1 below the first upper area UP1.

It should be noted that an upper area and a lower area described herein are distinguished based on whether or not the thickness of a layer increases during changing a profile of the layer. For example, an area in which the thickness of the first layer 10 decreases during operation S120 of changing the profile of the first layer 10 may be classified as the first upper area UP1, and an area in which the thickness of the first layer 10 increases may be classified as the first lower area DN1. In addition, a first boundary line BD1 may be defined as a boundary line dividing the first upper area UP1 and the first lower area DN1.

For example, during operation S123 of increasing the width of the first recess R1, the width of the first recess R1 in the first upper area UP1 may increase from D1U to D1U'. During operation S125 of reducing the width of the first recess R1, the width of the first recess R1 in the first lower area DN1 may decrease from D1L to D1L'. As a result, based on the first boundary line BD1 between the first upper area UP1 and the first lower area DN1, the width of the first layer 10 may decrease (above the boundary line) or increase (below the boundary line).

In some embodiments, operation S123 of increasing the width of the first upper area UP1 may be performed to suppress the formation of a void in the first upper area UP1.

Because the gap between layers formed on both sides of a protrusion is narrowed so that a void is formed when the layers are in contact with each other, the formation of a void may be suppressed when a width of a recess is increased. On the other hand, operation S125 of reducing the width of the first lower area DN1 may be performed to induce the formation of a void. That is, by reducing a width of a recess, layers formed on both sides of a protrusion may contact each other, and as a result, the formation of a void may be induced.

In some embodiments, operation S120 of changing the profile of the first layer 10 may include applying second plasma. The applying of the second plasma may be performed while operations S123 and S125 described above are performed. In a further embodiment, operation S120 of changing the profile of the first layer 10 may further include supplying a reactant gas. In some embodiments, in order to change the profile of the first layer 10, a second sub-cycle including the applying of the second plasma and/or the supplying of the reactant gas may be repeated.

In some embodiments, the applying of the second plasma and the supplying of the reactant gas may be performed simultaneously. In another embodiment, the applying of the second plasma and the supplying of the reactant gas may be performed sequentially. In another embodiment, an operation of purging a residue after the supply of the reactant gas may be performed. In an optional further embodiment, the supply of purge gas may be continued during the changing of the profile of the first layer 10. In yet a further embodiment, the purge gas may be a reactive purge gas that acts as a reactant gas when plasma is applied.

For example, the second sub-cycle may include the applying of the second plasma and/or the supplying of the reactant gas (and further operations according to the modifications described above). In other words, to change the profile of the first layer 10, the second sub-cycle including at least one of the operations described above may be repeated.

In some embodiments, the second plasma may be different from the first plasma. In more detail, process parameters of the first plasma and the second plasma may be different. For example, the magnitude of power (e.g., RF power) of the second plasma may be greater than the magnitude of power of the first plasma. In another example, a frequency of the second plasma may be lower than a frequency of the first plasma.

In a further example, the frequency of the second plasma may include two ranges of frequencies. For example, when the frequency of the first plasma is in a first range of frequencies (e.g., an RF band), the frequency of the second plasma may include the first range of frequencies and a second range of frequencies (e.g., frequencies in a kilohertz band) less than the first range.

A substrate processing apparatus for realizing second plasma having a frequency of a dual band may include a matching network (see 55 in FIG. 23) configured to perform a matching operation with respect to the frequency of the dual band. For example, the matching network connected between an electrode (e.g., a showerhead and/or a susceptor) of a substrate processing apparatus and a power generator may be configured to perform a first matching operation for the first range of frequencies and a second matching operation for the second range of frequencies.

In another embodiment, the second plasma may be directional. For example, a bias may be applied such that ions generated by plasma face an upper surface (i.e., the first layer 10) of a substrate. The second plasma under a second condition (i.e., frequencies of large magnitude and/or small magnitude) may be suitable for breaking a bonding structure of the first layer 10.

In other words, due to application of the second plasma under the second condition, the bonding structure of the first layer 10 may be broken, and as a result, the profile of the first layer 10 may be changed. This change in the profile of the first layer 10 may include depression (i.e., destruction of the bonding structure and collapse as a result) of the first layer 10 due to the application of the second plasma and redeposition of the first layer 10 by the sputtered species generated during the destruction of the first layer 10 by the second plasma, i.e., constituents of the first layer 10. The depression of the first layer 10 may increase the width of the first recess R1 formed by the first layer 10 in the first upper area UP1, and the redeposition of the first layer 10 may reduce the width of the first recess R1 formed by the first layer 10 in the first lower area DN1.

Referring back to FIGS. 1 and 5, after operation S120 of changing the profile of the first layer 10, operation S210 of forming a second layer 20 may be performed. Operation S210 of forming the second layer may be performed in the same manner as the forming of the first layer. That is, in order to form the second layer 20, supplying a source gas, supplying a reactant gas, and applying first plasma may be performed. In addition, many of the modifications described in operation S110 of forming the first layer may also be applied to operation S210 of forming the second layer.

Figure 6:
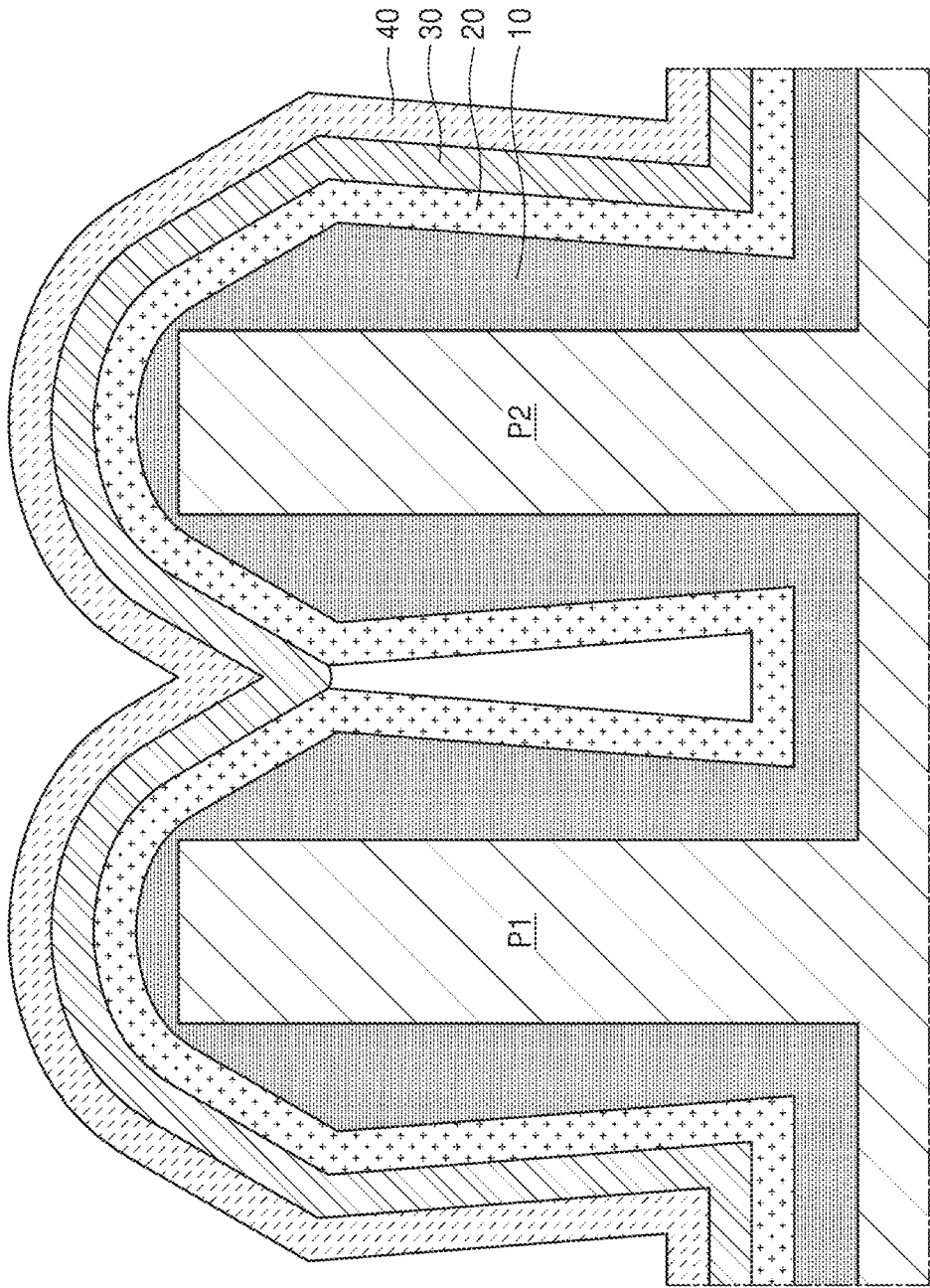

Thereafter, as shown in FIG. 6, a gap-filling operation is performed by forming subsequent layers (i.e., a third layer 30 and a fourth layer 40). Operation S310 of forming the subsequent layers may be performed in the same manner as operation S110 of forming the first layer. In some embodiments, the forming of the subsequent layers may be performed in a different manner from operation S110 of forming the first layer and/or operation S210 of forming the second layer.

For example, in some embodiments, operation S110 of forming the first layer and operation S310 of forming the third layer may be implemented in such a way that a source gas, a reactant gas, and a plasma are simultaneously applied to improve a film growth rate. On the other hand, operation S210 of forming the second layer may be performed by sequentially supplying a source gas and a reactant gas (e.g., an ALD process). In this case, in the second layer 20, unit layers (e.g., atomic layers) may be sequentially stacked so that side surfaces of the unit layers may be in contact with each other, and a boundary surface by the contact of the unit layers and a void on the boundary surface may be formed.

Figure 7:
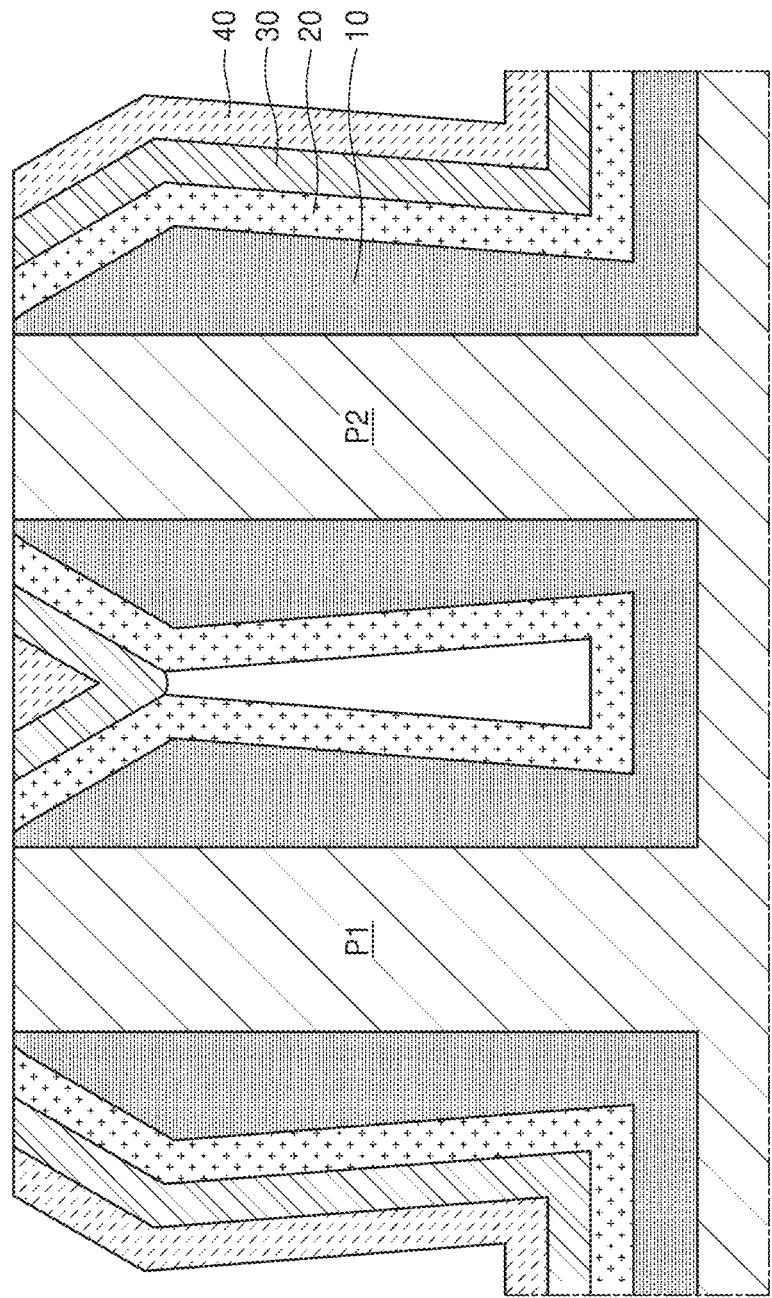

Thereafter, referring to FIGS. 1 and 7, operation S410 of planarizing a pattern structure is performed. For example, the planarization operation S410 may be performed to expose an upper surface of the pattern structure.

As described above, according to the disclosure, by performing a profile change operation to increase a width of an upper area of a recess while decreasing a width of a lower area of the recess, an accompanying void may be formed at a lower portion of a gap during a gap-filling process, and thus the problem of a void being exposed in a subsequent operation (i.e., the planarization operation S410) may be prevented.

Figure 8:
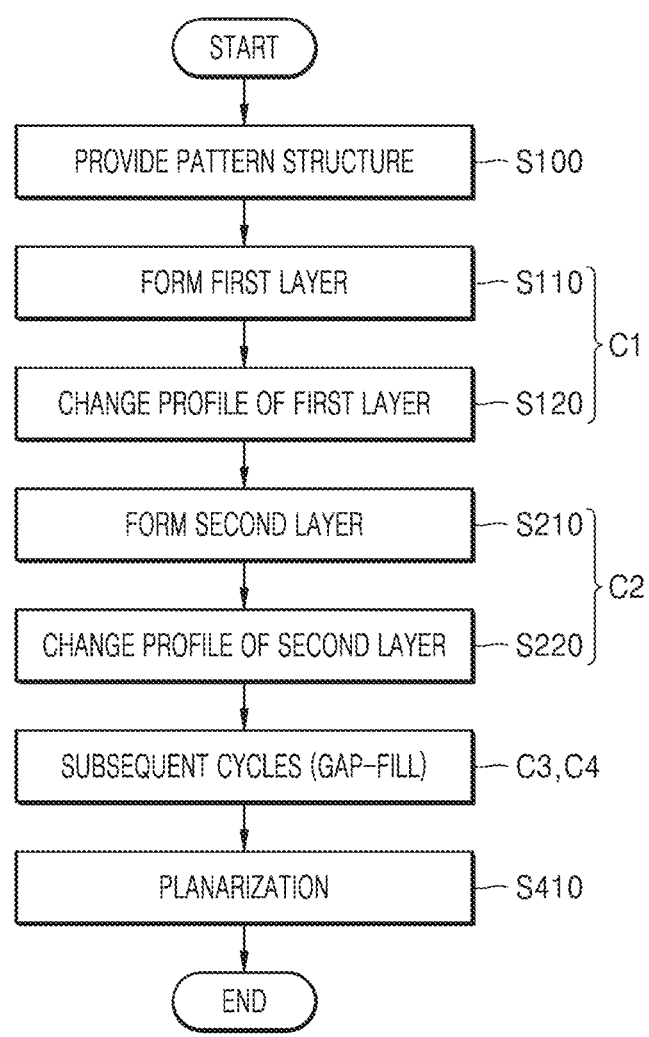
FIG. 8 is a flowchart of a substrate processing method according to embodiments.
Figure 9:
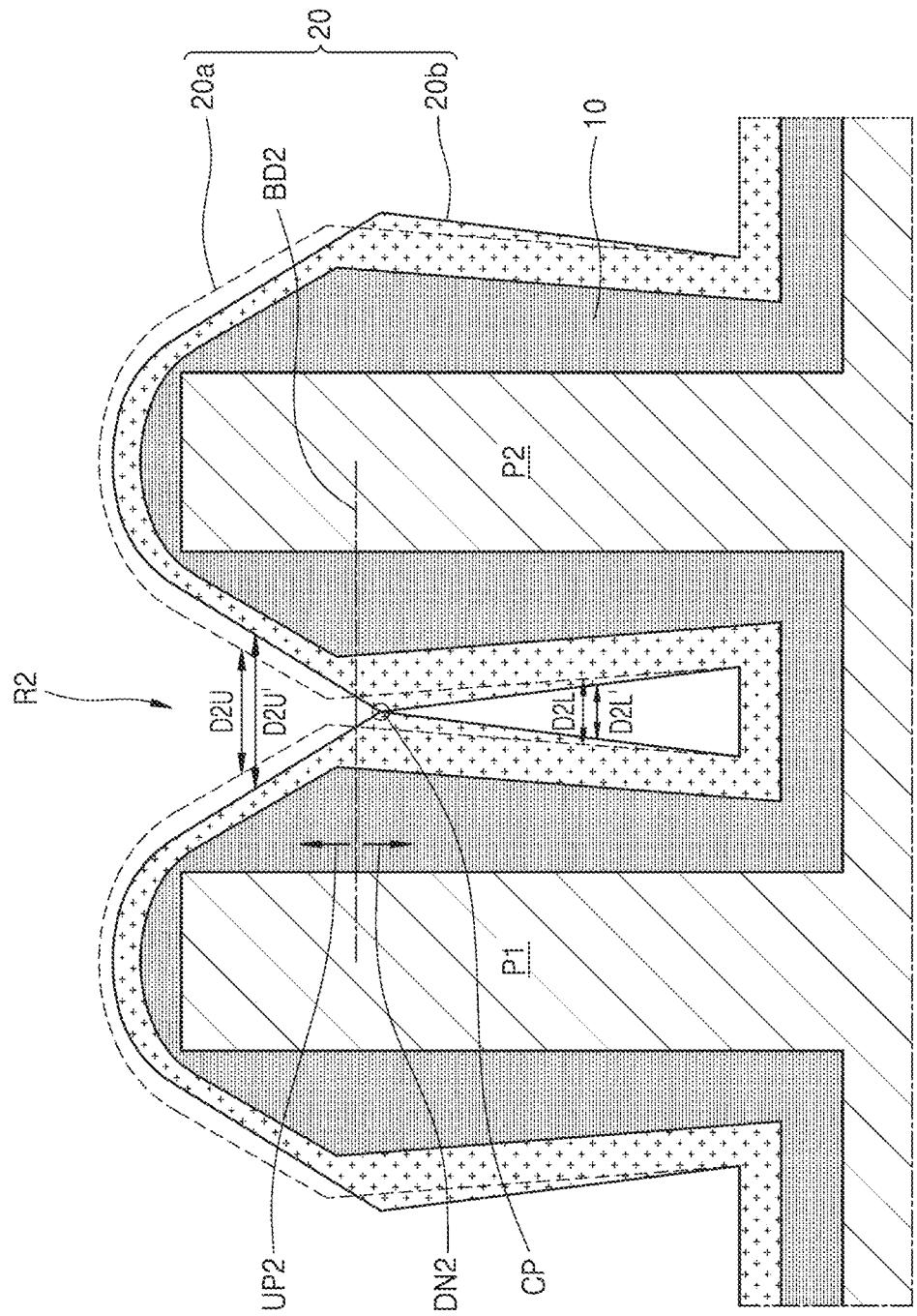
FIGS. 9 to 11 are cross-sectional views of a substrate in some stages of the substrate processing method illustrated in FIG. 8.
Figure 10:
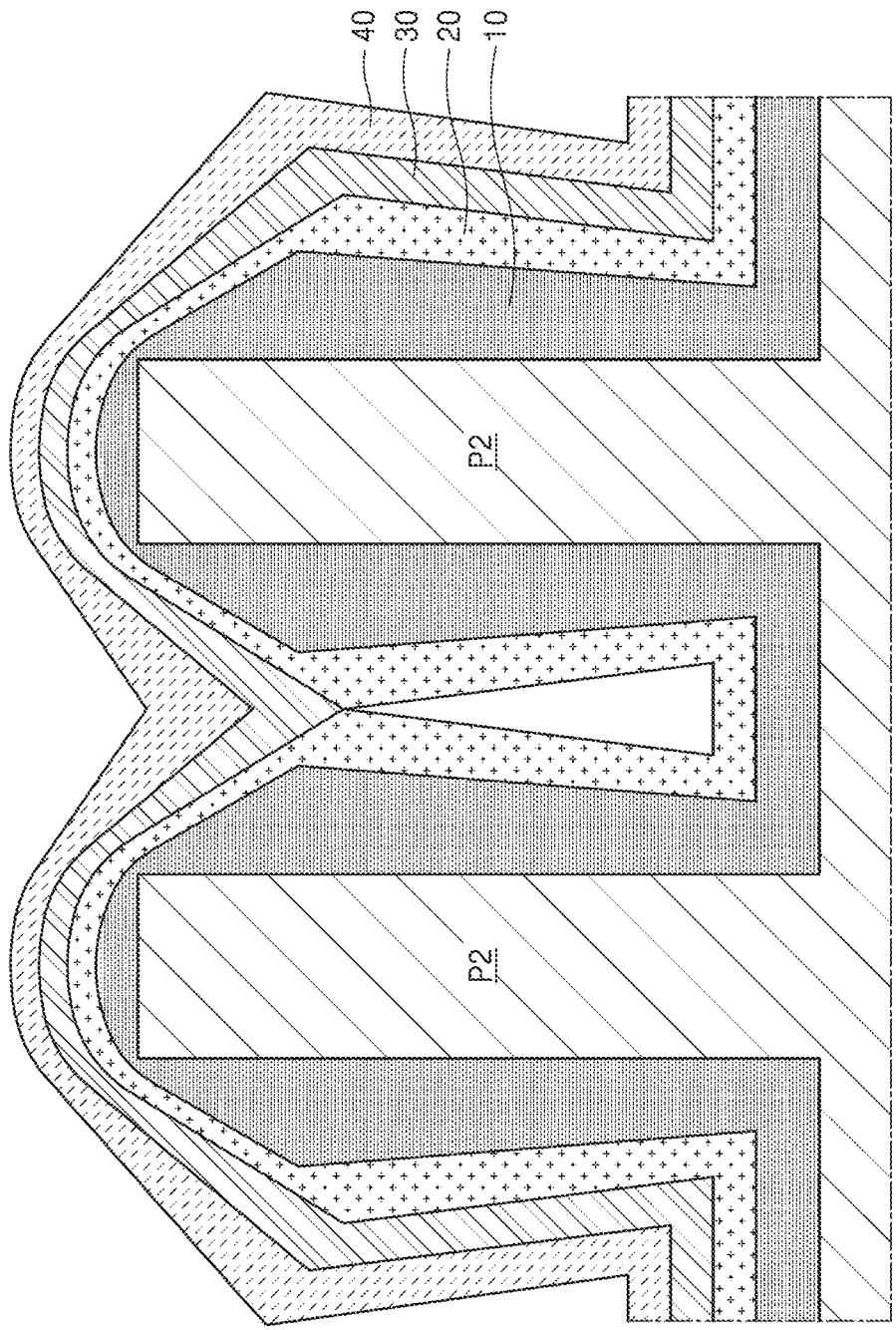
Figure 11:
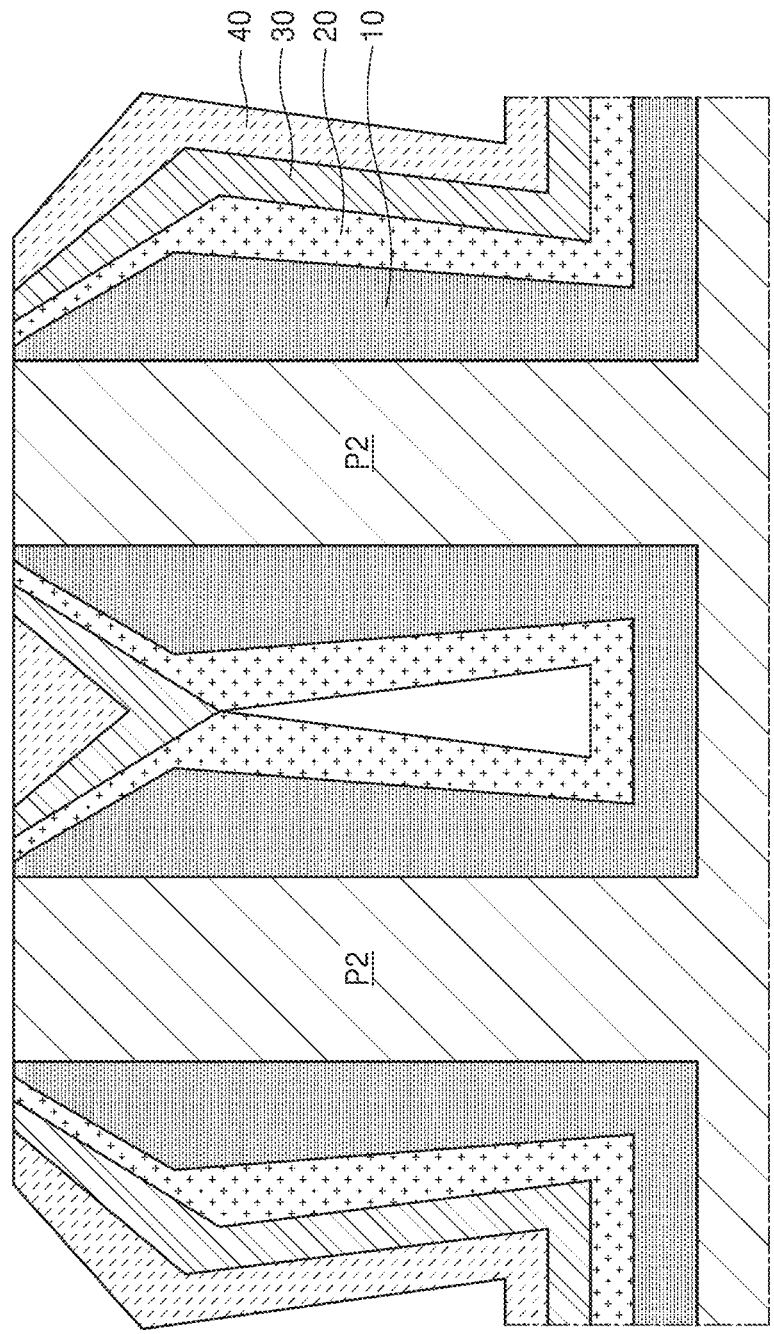

FIG. 8 is a flowchart of a substrate processing method according to embodiments. FIGS. 9 to 11 are cross-sectional views of a substrate in some stages of the substrate processing method illustrated in FIG. 8.

The substrate processing method according to the embodiments may be a variation of the substrate processing method according to the above-described embodiments. In more detail, preparing a pattern structure S100, operation S110 of forming the first layer, and operation S120 of changing the profile of the first layer shown in FIG. 8 may be the same as operations S100, S110 and S120 shown in FIG. 1. Hereinafter, redundant descriptions will not be given herein.

In order to achieve gap-filling of a space between the first protrusion P1 and the second protrusion P2, a cycle including forming a layer and changing a profile of the formed layer may be repeated a plurality of times. In more detail, as shown in FIG. 8, the cycle may include a first cycle C1 including operation S110 of forming the first layer and operation S120 of changing a profile of the first layer and a second cycle C2 including operation S210 of forming a second layer and operation S220 of changing a profile of the second layer.

The appearance of a substrate after the second cycle C2 is shown in FIG. 9. That is, FIG. 9 shows a state after operation S120 of changing the profile of the first layer, in which the profile of the second layer 20 is changed by forming a second layer 20a having a uniform thickness and then applying plasma suitable for breaking a bonding structure of the second layer having a uniform thickness. In FIG. 9, the second layer 20a having a uniform thickness is indicated by dashed lines, and a second layer 20b having a changed profile is indicated by a solid line.

During the second cycle C2, the second layer 20a having a uniform thickness may be formed, and thus a second recess R2 having a second width may be formed between the first protrusion P1 and the second protrusion P2 by forming the second layer 20a. Thereafter, as the profile of the second layer 20a is changed, a width of the second recess R2 in a second upper area UP2 may increase, and a width of the second recess R2 in a second lower area DN2 may decrease. As a result, based on a second boundary line BD2 between the second upper area UP2 and the second lower area DN2, a width (or thickness) of the second layer 20 may decrease (above the boundary line) or increase (below the boundary line).

As described above, an upper area and a lower area described herein may be distinguished based on whether the thickness of a layer increases during changing a profile of the layer. For example, while the second layer 20b is formed by changing the profile of the second layer 20a having a uniform thickness, an area in which a thickness of the second layer 20a decreases may be classified as the second upper area UP2, and an area in which the thickness of the second layer 20a increases may be classified as the second lower area DN2. In addition, the second boundary line BD2 may be defined as a boundary line dividing the second upper area UP2 and the second lower area DN2.

In more detail, by the formation of the second layer 20a, in the second upper area UP2 of the second recess R2 adjacent to edge portions of the first protrusion P1 and the second protrusion P2, the second recess R2 may have a second upper width D2U, and in the second lower area DN2 below the second upper area UP2, the second recess R2 may have a second lower width D2L. Thereafter, as the second layer 20b with a changed profile is formed, the second recess R2 may change to have a second upper width D2U' and a second lower width D2L'.

In some embodiments, a width of the second lower area DN2 of the second recess R2 may decrease from D2L to D2L', and due to this decrease, a contact portion CP in which a first portion of the second layer 20 on a side surface of the first protrusion P1 and a second portion of the second layer 20 on a side surface of the second protrusion P2 contact each other may be formed. Due to this contact, a void may be formed in the second lower area DN2.

As such, by performing a profile change operation of increasing a width of the second upper area UP2 of the second recess R2 and decreasing a width of the second lower area DN2 of the second recess R2 at the same time, a void generated during a gap-filling process may be located further down. In other words, because the second lower area DN2 of FIG. 9 is located lower than the first lower area DN1 of FIG. 4, the possibility that a void is exposed in embodiments of FIGS. 8 and 9 to 11 may be less than the embodiments of FIGS. 1 and 2 to 7. This may also be explained based on a state in which the second boundary line BD2 in FIG. 9 is below the first boundary line BD1 in FIG. 4.

Thereafter, cycles are repeated so that the space between the first protrusion P1 and the second protrusion P2 is filled so that the gap-filling operation is performed. FIG. 10 shows how the gap-filling is achieved by subsequent cycles. In other words, by performing a third cycle C3 including forming the third layer 30 and changing a profile of the third layer; and a fourth cycle C4 including forming the fourth layer 40 and changing a profile of the fourth layer, the space between the first protrusion P1 and the second protrusion P2 may be filled.

Thereafter, referring to FIGS. 8 and 11, operation S410 of planarizing a pattern structure is performed. As described above, the planarization operation S410 may be performed to expose an upper surface of the pattern structure.

As described above, by performing a gap-filling operation using first plasma for forming a layer and second plasma for changing a profile of the formed layer, even if a void is formed, the formed void may be located at a relatively low position (i.e., a lower portion of a recess). Accordingly, a problem (a problem that a void is exposed by planarization and a metal material penetrates into the void) that may be caused by subsequent processes (e.g., a BEOL metal process after planarization) may be prevented.

In some embodiments, by adjusting process parameters of a layer forming operation using the first plasma and a layer profile changing operation using the second plasma, the position of the void may be changed.

For example, when applying the first plasma is performed for a first time period and applying the second plasma is performed for a second time period, by adjusting a ratio between the first time period and the second time period, a position of a void remaining after gap-filling of the pattern structure may be changed. For example, by increasing the second time period compared to the first time period to further expand a width of an upper area of a recess, a void may be located lower.

In another example, when a first sub-cycle including the applying of the first plasma is performed m times and a second sub-cycle including the applying of the second plasma is performed n times, a ratio of m and n may be adjusted. That is, by adjusting a ratio between the number of repetitions of the first sub-cycle and the number of repetitions of the second sub-cycle, a position of a void remaining after gap-filling of the pattern structure may be changed. For example, by increasing the number of repetitions of the second sub-cycle compared to the number of repetitions of the first sub-cycle to further expand a width of an upper area of a recess, a void may be located lower.

Figure 12:
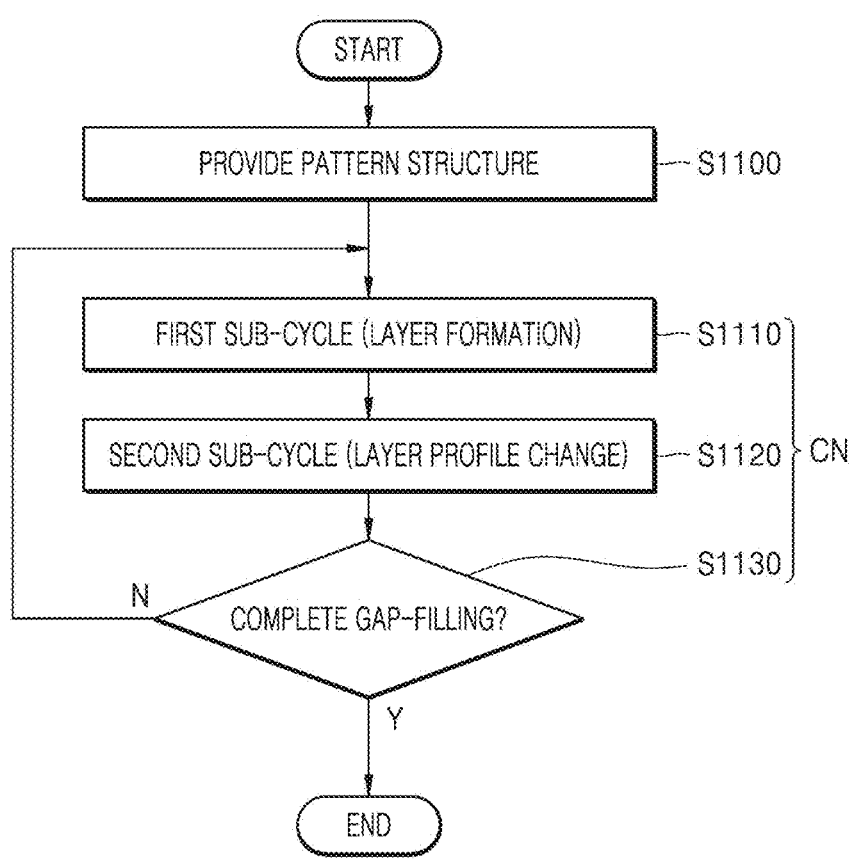
FIGS. 12 and 13 are views illustrating a substrate processing method according to embodiments.
Figure 13:
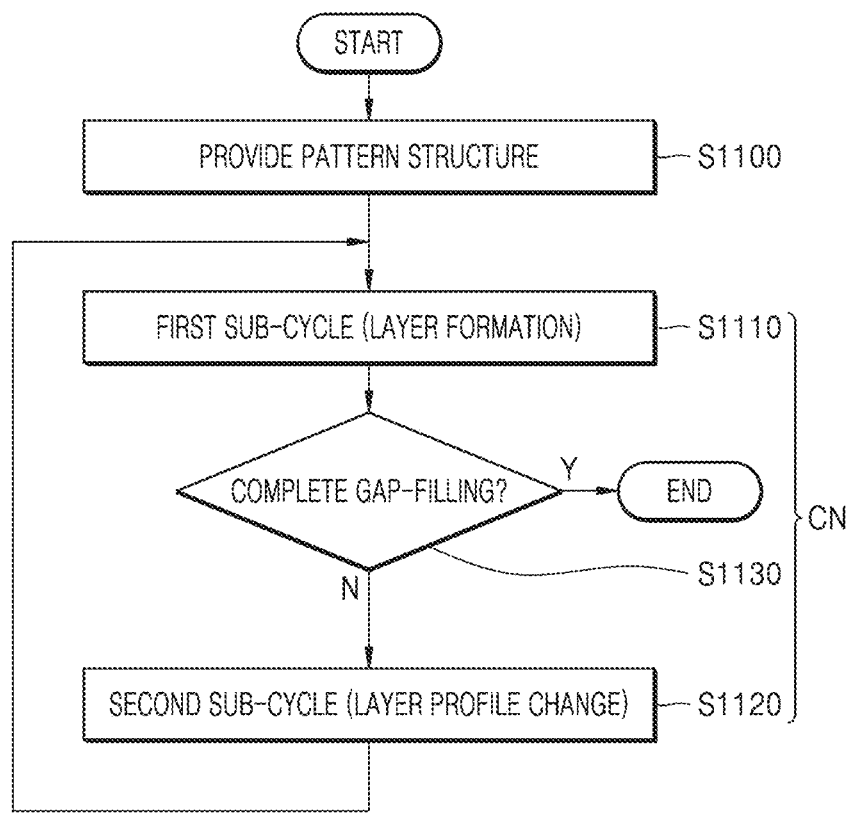

FIGS. 12 and 13 are views illustrating a substrate processing method according to embodiments. The substrate processing method according to the embodiments may be a variation of the substrate processing method according to the above-described embodiments. Hereinafter, repeated descriptions of the embodiments will not be given herein.

Referring to FIG. 12, in order to perform gap-filling on a pattern structure, a cycle CN including a first sub-cycle (operation S1110) and a second sub-cycle (operation S1120) may be performed a plurality of times, and then, in operation S1130, it may be determined whether the gap-filling is completed. For example, when the number of repetitions of a cycle reaches a certain value, it is determined that gap-filling is completed, and the gap-filling operation is terminated. Conversely, when the number of repetitions of the cycle does not reach a certain value, the number of repetitions of the cycle is increased and the first sub-cycle (operation S1110) and the second sub-cycle (operation S1120) are performed again. In another embodiment, the determination of whether the gap-filling operation is completed (operation S1130) may be performed between the first sub-cycle (operation S1110) and the second sub-cycle (operation S1120) as shown in FIG. 13.

Figure 14:
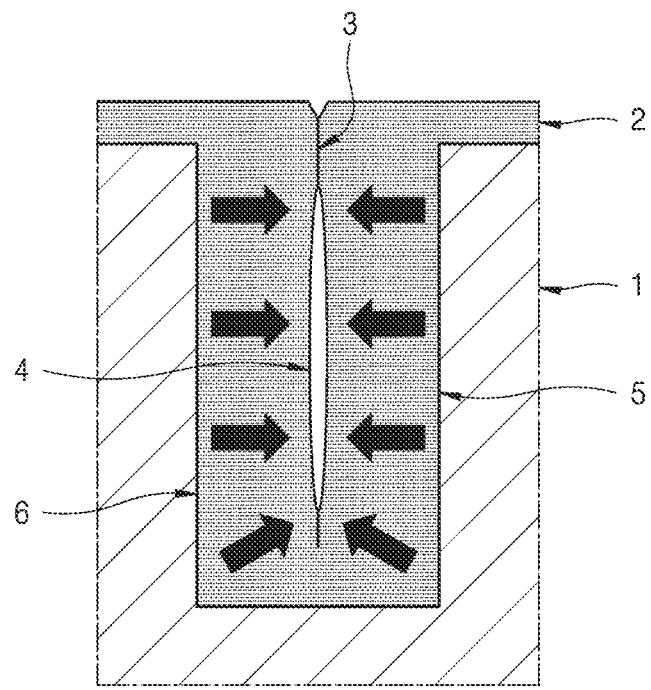
FIG. 14 is a view of a boundary surface and a void in a gap generated when the gap is filled by atomic layer deposition.

FIG. 14 shows a boundary surface and a void in a gap generated when the gap is filled with a film by atomic layer deposition.

Figure 15:
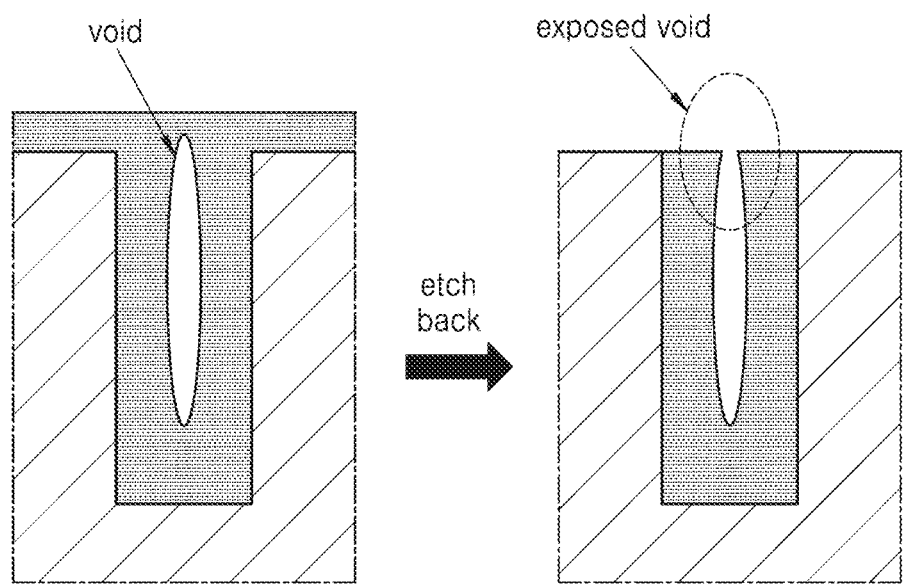
FIG. 15 is a view illustrating that the void is exposed by a subsequent process after filling the gap in FIG. 14.

In FIG. 14, a thin film 2 is sequentially stacked on two different surfaces 5 and 6 of a gap structure toward the opposite surface (in the direction of arrows). In addition, interfaces of the stacked surfaces are in contact with each other to form a boundary surface 3. A void 4 may be formed in a portion of the boundary surface 3. For example, when an upper area of the gap structure is closed first, in a lower area of the boundary surface, the void 4 may be formed between two interfaces. Because the boundary surface 3, which is an area between interfaces of two films stacked in different directions, is not a place where chemical bonding between the two layers is made, in a process of filling the gap structure in a stacked manner, the boundary surface 3 is generated. FIG. 15 shows that a void is exposed by a subsequent process.

In FIG. 15, a void formed inside a film filling a gap structure may be exposed to the outside after a subsequent etch-back process. In addition, through the exposed void, for example, a metal wiring material may penetrate, and the insulating properties of the film may be destroyed. As described above, in a gap-filling process of filling a gap structure by layer-by-layer deposition, films grow in different directions, and a boundary surface exists between stacked films. Accordingly, alternatives are being considered to maintain the properties of a film by minimizing the exposure of the void.

Therefore, the disclosure provides a method for minimizing exposure of a void formed at a boundary surface in a gap-filling process of filling a gap structure by layer-by-layer deposition. In more detail, disclosed is a method for minimizing exposure of a void on a boundary surface formed when gap structure is filled by an atomic layer deposition method.

Figure 16:
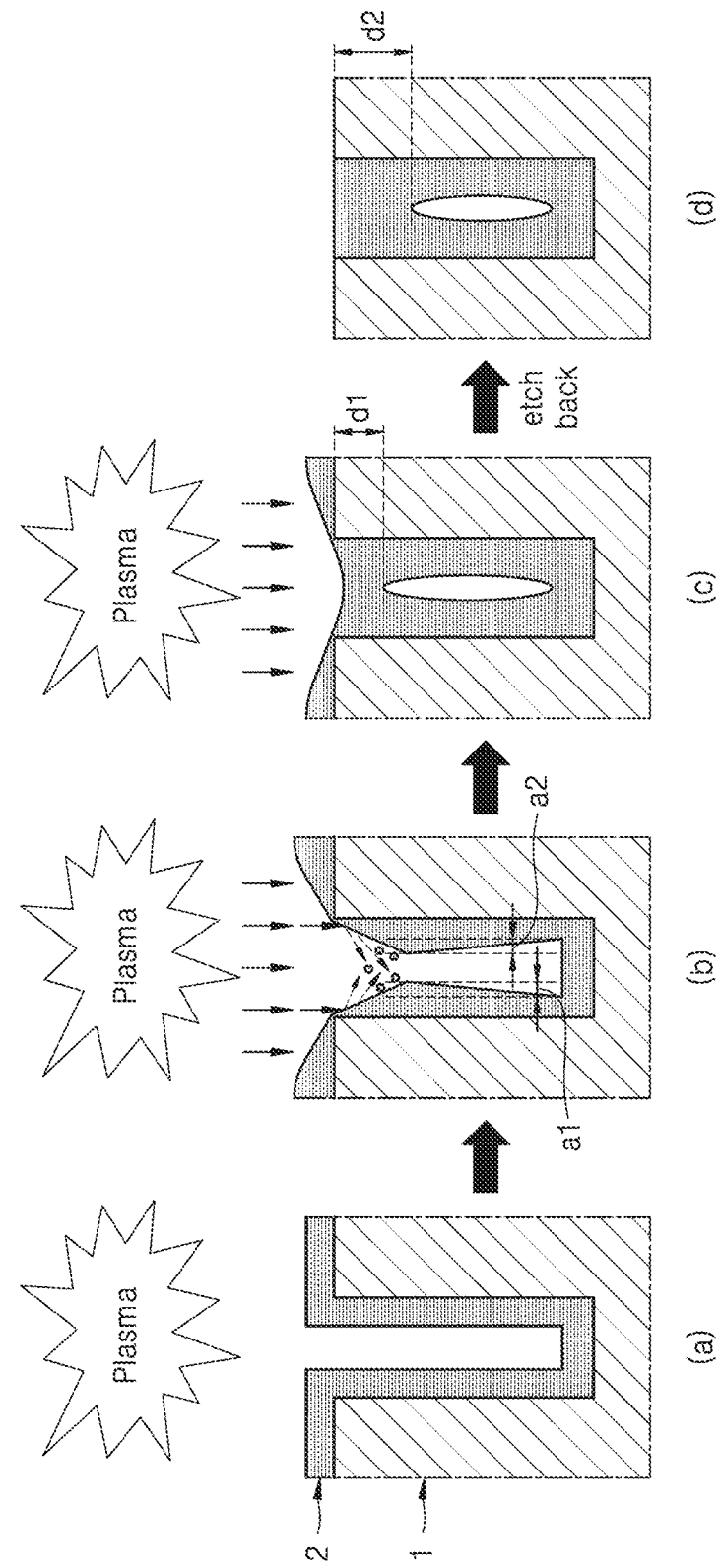
FIG. 16 is a view illustrating a method of controlling a position of a void in a gap structure, according to an embodiment.

FIG. 16 illustrates a method of controlling a position of a void in a gap structure according to an embodiment.

A detailed description of each step of FIG. 16 is as follows.

STEP1 (*a*): The thin film 2 is deposited on a gap structure 1. The thin film 2 is deposited by a method of depositing a film by layer-by-layer deposition, and a source gas, a reactant gas, and first RF power are supplied together to deposit a film. Because the source gas and the reactant gas are simultaneously decomposed by a first RF power, the reactivity between gases is improved, a film formation is promoted, and a film growth rate is high. However, the intensity of the first RF power supplied to improve the conformality of a film deposited on a surface of a gap structure is set so as not to excessively dissociate source gas molecules. Alternatively, the intensity of the first RF power is set to such an extent that a bonding force of source gas molecules is weakened. That is, a complete CVD reaction may be prevented, but a film conformality and high film growth rate may be achieved at the same time.

Figure 17:
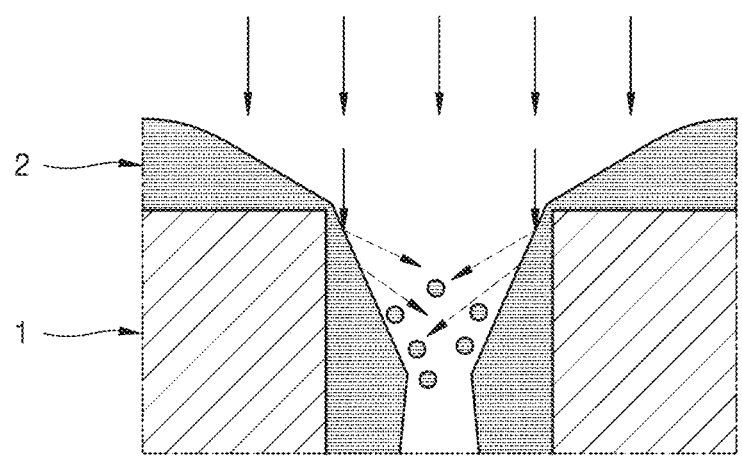
FIG. 17 is an enlarged view of (b) in FIG. 16.

STEP2 (*b*): In STEP2, plasma treatment is performed by supplying second RF power to a film deposited on an upper area and supplying a reactant gas, a purge gas, or a mixture thereof. In more detail, by conducting ion bombardment on the film on its upper area, a bonding structure of the film on the upper area is physically weakened/destroyed. Sputtered film particles from one surface by the ion bombardment move to a surface of a film facing them, where they are re-deposited and increase the thickness of a film in that area (a1 and a2). In FIG. 16 (*b*), this phenomenon is concentrated in an upper area of a gap, such that weakening/breaking of a film formed in the upper area and an increase in thickness of a film in an lower area of the gap proceed together. FIG. 17 is an enlarged view of FIG. 16 (*b*).

STEP3 (*c*): By repeating STEP1 and STEP2, an upper area of a gap is closed, and a void is formed inside the gap. The void in a gap structure has a depth of d1.

STEP4 (*d*): While repeating STEP1 and STEP2 continuously, collapse of the upper area of the gap and redeposition at a sidewall of the upper area continue, and the depth of the void increases (d2>d1). In other words, as deposition-sputtering-redeposition is repeated, an area where a redeposition and a film growth rate increase in the upper area of the gap is expanded, and the depth of the void increases. Even after a subsequent etch-back process is performed, the void is not exposed to the outside and an upper portion of the gap is still maintained in a closed state.

According to FIG. 16, by applying ion bombardment with plasma active species to a film stacked on an upper area of the gap structure, and weakening or destroying a bonding structure of the film in the upper area, the film profile in the upper area collapses and is deformed into a depressed profile toward an inner direction of the gap. Therefore, the upper area of the gap is artificially closed, and a void is formed inside the gap. By repeating this process, there is a technical effect that the upper area of the gap continues to be depressed under the influence of ion bombardment, eventually resulting in a greater depth of the void in the gap, and even if the subsequent etch-back process is performed, the void is not exposed and the upper portion of the gap may still be maintained in a closed state. In addition, according to FIG. 16 (*a*), when depositing a film on a surface of the gap structure, there is a technical effect of improving a film growth rate speed while preventing a decrease in film conformality by supplying a source gas, a reactant gas, and RF power at the same time. In other words, there is a technical effect of preventing the void inside the gap from being exposed in a subsequent process while controlling the location of the void and a high film growth rate on the gap structure.

Figure 18:
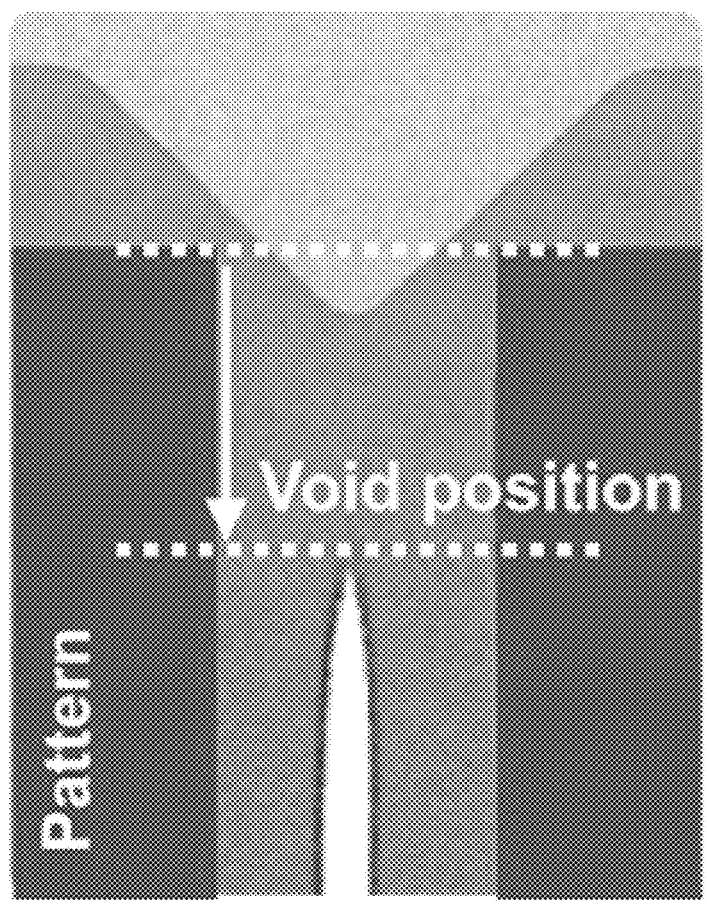
FIG. 18 is a transmission electron microscope (TEM) photograph showing that an upper portion of a gap is closed and a position of a void is deepened because of depression by ion bombardment of a deposited film in an upper area of a gap structure and redeposition of film particles by sputtering, according to an embodiment.

FIG. 18 is a transmission electron microscope (TEM) photograph showing that an upper portion of a gap is closed and a position of a void is deepened because of depression by ion bombardment applied to a deposited film in an upper area of a gap structure and redeposition of film particles, i.e. film constituents by sputtering, according to an embodiment.

Figure 19:
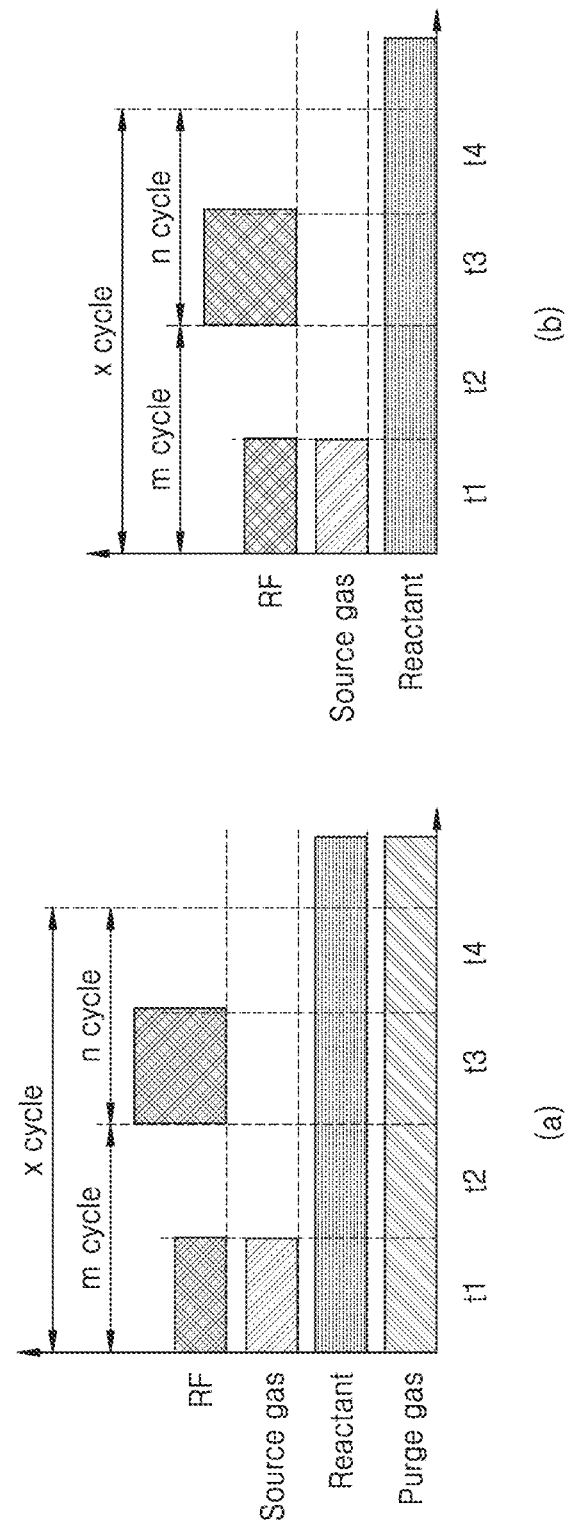
FIG. 19 is a flowchart of a substrate processing method according to embodiments.

A detailed description of each step of FIG. 19 is as follows.

STEP1 (t1 to t2): In this step, as a step of depositing a film on a surface of the gap structure, a source gas and a reactant gas are supplied together, and the source gas and the reactant gas are decomposed by a first RF power and chemically react to form a compound and a film (t1). Then, in a purge step (t2), reaction by-products are exhausted. This step is repeated at least once.

STEP2 (t3 to t4): In this step, as a plasma treatment step, a reactant gas or a purge gas activated by a second RF power or a mixture thereof is supplied. In this step, a film in an upper area of the gap structure has a profile in which a bonding structure is relaxed or destroyed by ion bombardment, and a film in the upper portion is depressed toward the inside. This step is repeated at least once. STEP1 and STEP2 may be repeated a plurality of times (x cycle) again forming a group cycle. As STEP1 and STEP2 are repeated, an upper portion of a gap is closed, and a void is located deeper inside the gap. Because the plasma treatment in this step performs ion bombardment on a film, it will be defined as a sputtering step below.

In FIG. 19, the intensity of RF power in STEP1 and STEP2 are different. In STEP 1, first RF power is supplied to the extent of dissociating source gas molecules and a reactant gas or weakening a bonding force within the source gas molecules to induce and promote the film deposition, and increase a film growth rate through decomposition and a chemical reaction of a source gas and the reactant gas. However, in STEP 2, in order to strengthen an ion bombardment effect, second RF power stronger than in STEP1 is supplied. Accordingly, by varying RF power applied to a deposition step and a sputtering step, film deposition and ion bombardment may be performed more effectively.

In addition, by applying the source gas, the reactant gas, and the first RF power together in the deposition step (STEP1) of FIG. 19, compared to the conventional plasma atomic layer deposition method, a film growth rate may be improved, thereby improving a substrate processing speed and efficiency.

Furthermore, by applying the second RF power in the sputtering step (STEP2) of FIG. 19, the film properties may be precisely controlled. For example, as in an embodiment, the position of a void in a gap may be controlled. In another embodiment, a wet etch rate (WER) of a film may be controlled.

In the disclosure, the film properties are controlled by adjusting the intensity of RF power, but the disclosure is not limited thereto. For example, in another embodiment, the object of the disclosure may be achieved by changing an RF frequency, an RF power application time, and an RF power supply method in STEP1 and STEP2. In another embodiment, in the deposition step, remote plasma may be applied, and in the sputtering step, plasma may be applied directly. In another embodiment, in the sputtering step, an additional gas may be supplied to enhance an ion bombardment effect. For example, a heavy gas such as argon may be supplied and activated.

Although a reactant gas and a purge gas are supplied together in FIG. 19 (a), in an embodiment according to FIG. 19 (b), only the reactant gas may be supplied without the purge gas. In that case, the reactant gas may be a reactive purge gas that reacts with the source gas only when RF power is applied. For example, when forming a silicon oxide film, an oxygen gas may be supplied as a reactive purge gas. When forming a silicon nitride film, a nitrogen gas may be supplied as a reactive purge gas.

In an embodiment according to FIG. 19, the source gas may be a gas containing silicon. For example, the source gas may be at least one of aminosilane, iodosilane, or a silicon-containing gas (halide) containing a halogen element. The reactant gas may be a gas containing oxygen or nitrogen. For example, the reactant gas may be at least one of $O_2$, $N_2O$, $NO_2$, $O_3$, $N_2$, $N_2H_2$ (diimide), and $NH_3$, or a mixture thereof. In such a case, a film deposited on a gap structure may be at least one of $SiO_x$, $Si_xN_y$, SiON, and SiCN, or a mixture thereof.

Figure 20:
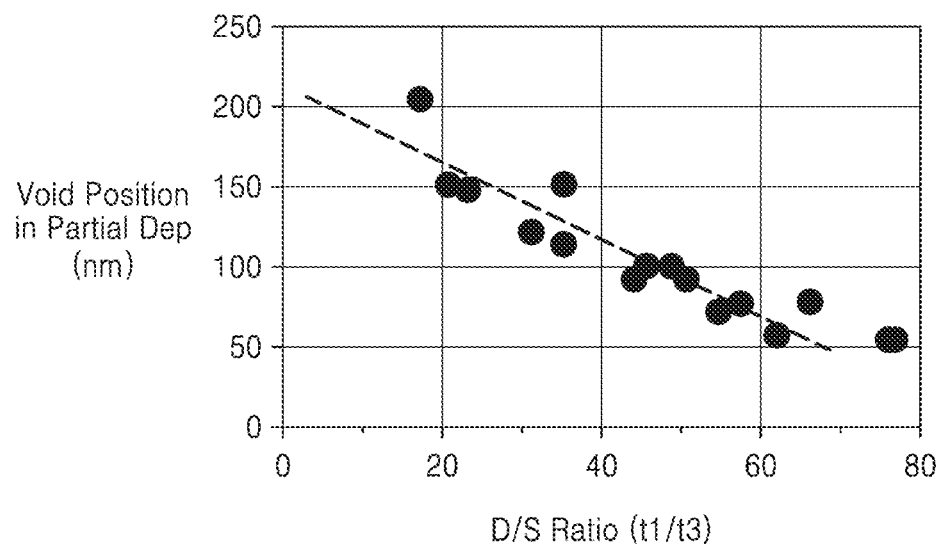
FIG. 20 is a graph illustrating a depth of a void according to a progress ratio of a deposition step and a sputtering step of FIG. 19.

FIG. 20 illustrates a depth of a void according to a progress ratio of a deposition step and a sputtering step of FIG. 19.

According to FIG. 20, it can be seen that the lower a progress ratio (D/S) of the deposition step D (STEP1) and the sputtering step S (STEP2), that is, the more the sputtering step proceeds, the deeper the position of the void in a gap is. The progress ratio may be a ratio of the number of repetitions or a ratio of a difference in applied RF power. Alternatively, the progress ratio may be a ratio of an RF power application time or a ratio of a difference in an applied RF power frequency. Accordingly, by differently controlling an RF power application method in the deposition step and the sputtering step, the position of the void in a gap structure may be controlled and exposure of the void may be suppressed in a subsequent process.

Figure 21:
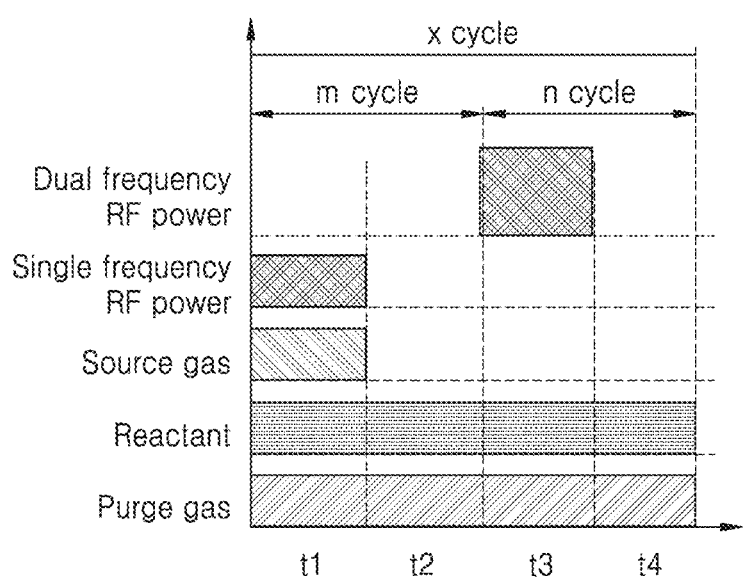
FIG. 21 is a graph illustrating a process flow according to another embodiment.

FIG. 21 illustrates a process flow according to another embodiment.

According to FIG. 21, single-frequency RF power is supplied in the deposition step (t1) and dual-frequency RF power is supplied in the sputtering step (t3). The single-frequency RF power may be high-frequency RF power and the dual-frequency RF power may be low frequency/high-frequency RF power. The dual-frequency RF power application may be a supply of low-frequency RF power and high-frequency RF power together. When the dual-frequency RF power is applied, the amount of ions generated increases and an ion bombardment effect increases. In addition, as a travelling distance of ions is increased, an upper area of a gap to which ion bombardment is applied may be expanded, so that the position of a void inside the gap may be made deeper.

Figure 22:
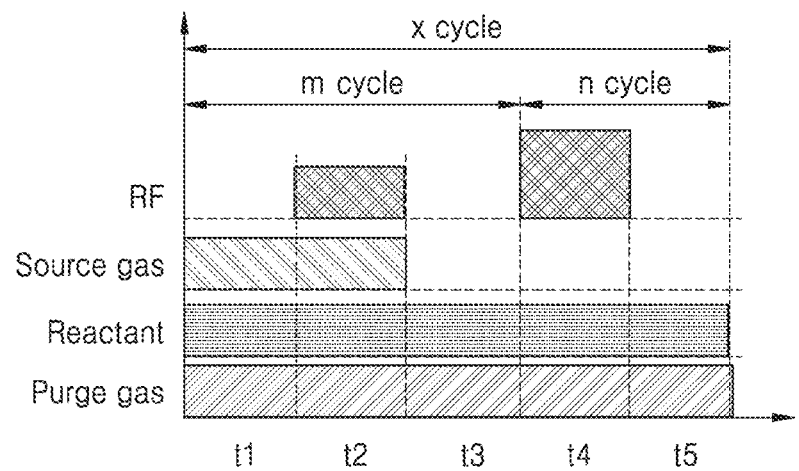
FIG. 22 is a graph illustrating a process flow according to another embodiment.

FIG. 22 illustrates a process flow according to another embodiment.

In FIG. 22, a preflow step (t1) is further added to the deposition step. In the preflow step (t1), a source gas and a reactant gas are first supplied before RF power is supplied, so that a plasma matching time is reduced in a reactor, so that more stable plasma generation is possible during a short RF power application time.

Table 1 shows substrate processing conditions according to an embodiment.

| | | |
|---|---|---|
| Temperature (° C.) | | 50° C. to 650° C. (preferably 500° C. to 600° C.) |
| Process pressure (Torr) | | 1 Torr to 5 Torr (preferably 2 Torr to 4 Torr) |
| Si source | | DIPAS (diisoprophylaminosilane) |
| Gas flow rate (sccm) | $O_2$ | 500 sccm to 4,000 sccm (preferably 1,000 sccm to 3,000 sccm) |
| | Source carrier Ar | 500 sccm to 10,000 sccm (preferably 3,000 sccm to 5,000 sccm) |

-continued

| | | | |
|---|---|---|---|
| | Purge Ar | 500 sccm to 4,000 sccm (preferably 1,000 sccm to 3,000 sccm) | |
| | Reactant carrier Ar | 500 sccm to 4,000 sccm (preferably 1,000 sccm to 3,000 sccm) | |
| Processing time per unit cycle (sec) | pre-flow step | 0.0 second to 0.5 second (preferably 0.1 sec to 0.3 sec) | |
| | Deposition step | 0.1 second to 1.0 second (preferably 0.2 sec to 0.6 sec) | |
| | Purge step | 0.1 second to 0.5 second (preferably 0.2 sec to 0.6 sec) | |
| | Sputtering step | 0.1 second to 5.0 second (preferably 1.0 sec to 4.0 sec) | |
| | Purge step | 0.1 second to 0.5 second (preferably 0.1 sec to 0.3 sec) | |
| Plasma condition | Deposition step (Single frequency) | RF power | 100 W to 2,000 W (preferably 200 W to 1,000 W) |
| | | RF frequency | 10 MHz to 100 MHz (preferably 12 MHz to 60 MHz) |
| | Sputtering step (Dual frequency) | RF power | 100 W to 2,000 W-high frequency band (preferably 1,000 W to 1,500 W) 100 W to 1,000 W-low frequency band (preferably 500 W to 900 W) |
| | | RF frequency | 10 MHz to 100 MHz-high frequency band (preferably 12 MHz to 60 MHz) 100 KHz to 500 KHz-low frequency band (preferably 150 KHz to 450 KHz) |

Under the conditions of Table 1, in the deposition step, high-frequency single-frequency RF power is supplied, and in the sputtering step, dual-frequency RF power, that is, high-frequency RF power and low-frequency RF power are supplied. Diisoprophylaminosilane (DIPAS) is used as a Si source in the processing conditions of Table 1, and a $SiO_2$ film is deposited on a gap structure by supplying an oxygen gas as a reactant gas. However, as a Si source, various kinds of aminosilane gases other than DIPAS may be used. Alternatively, an iodosilane, silicon halide-based Si source may be used. For example, the Si source may include at least one of TSA, $(SiH_3)_3N$; DSO, $(SiH_3)_2$; DSMA, $(SiH_3)_2NMe$; DSEA, $(SiH_3)_2NEt$; DSIPA, $(SiH_3)_2N(iPr)$; DSTBA, $(SiH_3)_2N(tBu)$; DEAS, $SiH_3NEt_2$; DTBAS, $SiH_3N(tBu)_2$; BDEAS, $SiH_2(NEt_2)_2$; BDMAS, $SiH2(NMe_2)_2$; BTBAS, $SiH_2(NHtBu)_2$; BITS, $SiH_2(NHSiMe_3)_2$; DIPAS, $SiH_3N(iPr)_2$; TEOS, $Si(OEt)4$; $SiCl_4$; HCD, $Si_2Cl_6$; 3DMAS, $SiH(N(Me)_2)_3$; BEMAS, Si $H_2[N(Et)(Me)]_2$; AHEAD, $Si_2(NHEt)_6$; TEAS, $Si(NHEt)_4$; $Si_3H_8$; DCS, $SiH_2Cl_2$; $SiHI_3$; and $SiH_2I_2$, or a derivative thereof, or a mixture thereof. The oxygen reactant gas may include at least one of $O_2$, $O_3$, $CO_2$, $H_2O$, $NO_2$, $N_2O$, or a mixture thereof.

Figure 23:
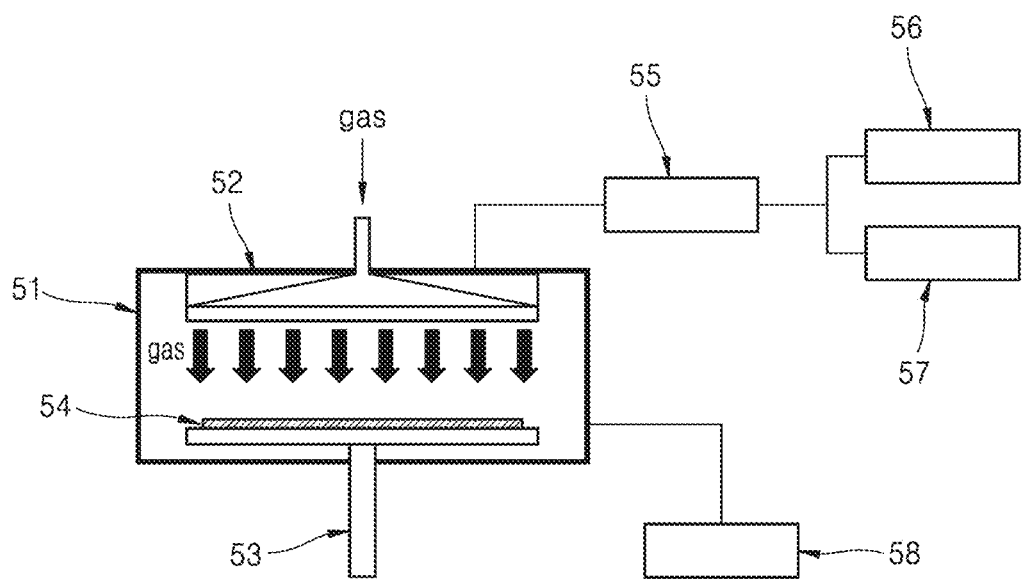
FIG. 23 is a schematic view of a reactor for applying an embodiment.

FIG. 23 is a schematic view of a reactor for applying an embodiment. A substrate 54 is loaded on a substrate support unit 53 of a reactor 51, and a gas inlet 52 is arranged in the opposite direction to the substrate support portion 53. The substrate support unit 53 may be a heating block that supplies thermal energy to the substrate 54, and the gas inlet 52 may be a showerhead. Gas is supplied from the outside to the substrate 54 in the reactor 51 through the gas inlet 52, and a processed gas is exhausted through an exhaust unit 58. The exhaust unit 58 may be an exhaust pump. The gas inlet 52 is connected to a high-frequency power supply unit, and the high-frequency power supply unit includes a matching network 55, a high-frequency RF power generator 56, and a low-frequency RF power generator 57.

In an embodiment according to FIG. 21 and Table 1, in the deposition step, RF power is supplied from the high-frequency RF power generator 56 to the reactor 51, and in the sputtering step, RF power is supplied to the reactor 51 from the high-frequency RF power generator 56 and the low-frequency RF power generator 57.

According to an embodiment, in forming a deposition film by stacking a film on a surface of a gap structure, a source gas, a reactant gas, and high-frequency power are simultaneously supplied to form a film, then in the sputtering step, an upper area of a gap is closed by performing ion bombardment with plasma active species on a film formed in an upper area of a gap structure and inducing redeposition on a side surface of the upper area of the gap, and the position of a void inside the gap may be controlled, and in a subsequent process, exposure of the void may be suppressed. In another embodiment, by supplying dual-frequency RF power in the sputtering step, the ion density and an ion bombardment effect on the upper area of the gap structure may be increased. In addition, by supplying a source gas, a reactant gas, and high-frequency power together to form a film, compared to the conventional plasma atomic layer deposition method, a film growth rate may be increased and a substrate processing speed per unit time may be further improved.

It should be understood that embodiments described herein should be considered in a descriptive sense only and not for purposes of limitation. Descriptions of features or aspects within each embodiment should typically be considered as available for other similar features or aspects in other embodiments. While one or more embodiments have been described with reference to the figures, it will be understood by those of ordinary skill in the art that various changes in form and details may be made therein without departing from the spirit and scope of the disclosure as defined by the following claims.

What is claimed is:

1. A substrate processing method comprising:
   providing a pattern structure having a first protrusion and a second protrusion, wherein upper surfaces of the first protrusion and the second protrusion each have a planar portion and an edge portion surrounding the planar portion;
   forming a first layer having a first thickness on the pattern structure, wherein a first recess of a first width is formed between the first protrusion and the second protrusion by the formation of the first layer; and
   after forming the first layer, using ion bombardment, changing a profile of the first layer, wherein the profile of the first layer is changed such that a width of the first recess in a first upper area adjacent to edge portions of the first protrusion and the second protrusion is greater than the first width, a width of the first recess in a first lower area below the first upper area is less than the first width, and a width of the first recess in an area below the first lower area is greater than the width of the first recess in a first lower area,
   wherein the forming of the first layer comprises applying a first plasma formed between a showerhead and a susceptor and the changing of the profile of the first layer comprises applying a second plasma between the showerhead and the susceptor, and
   wherein a plasma power is applied to the showerhead and/or the susceptor.

2. The substrate processing method of claim 1, wherein a cycle including the forming of the first layer and the changing of the profile of the first layer is repeated a plurality of times to achieve gap-filling of a space between the first protrusion and the second protrusion.

3. The substrate processing method of claim 2, wherein the cycle comprises:
forming a second layer on the first layer, wherein a second recess is formed between the first protrusion and the second protrusion by the formation of the second layer; and
changing a profile of the second layer, wherein during the changing of the profile of the second layer, a width of the second recess in a second upper area increases relative to a width of the second region in the second upper area after forming the second layer, and a width of the second recess in a second lower area below the second upper area decreases relative to a width of the second region in the second lower area after forming the second layer.

4. The substrate processing method of claim 3, wherein the second lower area is below the first lower area.

5. The substrate processing method of claim 3, wherein, due to a decrease in the width of the second recess in the second lower area, a first portion on a side surface of the first protrusion of the second layer and a second portion on a side surface of the second protrusion of the second layer come into contact with each other to form a void.

6. The substrate processing method of claim 5, wherein the void is included in the second lower area.

7. The substrate processing method of claim 1, wherein a matching network is connected to the showerhead and the susceptor.

8. The substrate processing method of claim 7, wherein an intensity of the second plasma is greater than an intensity of the first plasma.

9. The substrate processing method of claim 7, wherein a frequency of the second plasma is lower than a frequency of the first plasma.

10. The substrate processing method of claim 7, wherein a frequency of the first plasma is a first range of frequencies, and
a frequency of the second plasma includes the first range of frequencies and a second range of frequencies that is lower than the first range.

11. The substrate processing method of claim 7,
wherein the matching network is configured to perform a first matching operation for the first range of frequencies and a second matching operation for the second range of frequencies.

12. The substrate processing method of claim 7, wherein the applying of the first plasma is performed for a first time period,
the applying of the second plasma is performed for a second time period, and
by adjusting a ratio between the first time period and the second time period, a position of a void remaining in the pattern structure is changed.

13. The substrate processing method of claim 7, wherein a first sub-cycle including the applying of the first plasma during the forming of the first layer is performed a plurality of times,
a second sub-cycle including the applying of the second plasma during the changing of the profile of the first layer is performed a plurality of times, and
by adjusting a ratio between the number of repetitions of the second sub-cycle and the number of repetitions of the first sub-cycle, a position of a void in the pattern structure changed.

14. The substrate processing method of claim 1, wherein the forming of the first layer comprises supplying a source gas, supplying a reactant gas, and applying a first plasma, and
the changing of the profile of the first layer comprises supplying the reactant gas and applying a second plasma different from the first plasma.

15. The substrate processing method of claim 14, wherein the supplying of the source gas, the supplying of the reactant gas, and the applying of the first plasma are performed for a same time period.

16. The substrate processing method of claim 15, wherein the supplying of the source gas and the supplying of the reactant gas are pre-supplied before the same time period.

17. The substrate processing method of claim 14, wherein the forming of the first layer further comprises at least one of:
supplying a purge gas, between the supplying of the source gas and the supplying of the reactant gas; and
supplying a purge gas after the supplying of the reactant gas.

18. The substrate processing method of claim 1, comprising:
forming a second layer; and
forming a third layer,
wherein forming the first layer and forming the third layer comprise providing a source gas, a reactant gas, and a plasma during a period, and
wherein forming the second layer comprises sequentially supplying a source gas and a reactant gas.

* * * * *